United States Patent
Schober et al.

(10) Patent No.: US 10,446,547 B2
(45) Date of Patent: Oct. 15, 2019

(54) SUPER-SATURATION CURRENT FIELD EFFECT TRANSISTOR AND TRANS-IMPEDANCE MOS DEVICE

(71) Applicant: Circuit Seed, LLC, Newport Beach, CA (US)

(72) Inventors: Susan Marya Schober, Newport Beach, CA (US); Robert C. Schober, Huntington Beach, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 0 days.

(21) Appl. No.: 16/394,578

(22) Filed: Apr. 25, 2019

(65) Prior Publication Data
US 2019/0252382 A1 Aug. 15, 2019

Related U.S. Application Data

(63) Continuation of application No. 15/748,908, filed as application No. PCT/US2016/044800 on Jul. 29, 2016, now Pat. No. 10,283,506.
(Continued)

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823814* (2013.01); *H01L 27/0207* (2013.01);
(Continued)

(58) Field of Classification Search
CPC . H01L 2924/13085; H01L 2924/13092; H01L 21/823842; H01L 21/82345;
(Continued)

(56) References Cited

U.S. PATENT DOCUMENTS

| 3,887,878 A | 6/1975 | Schade, Jr. |
|---|---|---|
| 3,986,134 A | 10/1976 | Yokoyama |

(Continued)

FOREIGN PATENT DOCUMENTS

| CN | 101142686 | 3/2008 |
|---|---|---|
| CN | 102265403 | 11/2011 |

(Continued)

OTHER PUBLICATIONS

Aguirre, et al., "Temperature Controlled Measurement System for Precise Characterization of Electronic Circuits and Devices", IEEE Instrumentation and Measurement, 2014, 4 pages.
(Continued)

*Primary Examiner* — Earl N Taylor
(74) *Attorney, Agent, or Firm* — Lee & Hayes, P.C.

(57) ABSTRACT

The present invention relates to an improvement to a current field effect transistor and trans-impedance MOS devices based on a novel and inventive compound device structure, enabling a charge-based approach that takes advantage of sub-threshold operation, for designing analog CMOS circuits. The present invention further relates to a super-saturation current field effect transistor (xiFET), having a source, a drain, a diffusion, a first gate, and a second gate terminals, in which a source channel is defined between the source and diffusion terminals, a drain channel is defined between the drain and diffusion terminals. The first gate terminal is capacitively coupled to the source channel; and the second gate terminal is capacitively coupled to said drain channel. The diffusion terminal receives a current causing change in diffused charge density throughout said source and drain channel. The xiFET provides a fundamental building block for designing various analog circuites.

6 Claims, 31 Drawing Sheets

Related U.S. Application Data

(60) Provisional application No. 62/267,174, filed on Dec. 14, 2015.

(51) Int. Cl.
*H01L 27/02* (2006.01)
*H03F 1/08* (2006.01)
*H03F 3/04* (2006.01)
*H03F 3/45* (2006.01)
*H03F 3/16* (2006.01)

(52) U.S. Cl.
CPC .............. *H03F 1/086* (2013.01); *H03F 3/04* (2013.01); *H03F 3/165* (2013.01); *H03F 3/45179* (2013.01); *H03F 2203/45246* (2013.01)

(58) Field of Classification Search
CPC .............. H01L 27/092; H01L 27/0207; H01L 21/823814; H03F 3/45179; H03F 3/165; H03F 1/086
See application file for complete search history.

(56) References Cited

U.S. PATENT DOCUMENTS

| | | | |
|---|---|---|---|
| 4,100,502 A | 7/1978 | Yamashiro | |
| 4,247,859 A | 1/1981 | Rai-Choudhury et al. | |
| 4,282,477 A | 8/1981 | Ahmed | |
| 4,309,665 A | 1/1982 | Yamashiro | |
| 4,607,274 A | 8/1986 | Yoshitake | |
| 4,910,709 A | 3/1990 | Dhong et al. | |
| 4,927,779 A | 5/1990 | Dhong et al. | |
| 5,041,894 A | 8/1991 | Reczek et al. | |
| 5,349,311 A | 9/1994 | Mentzer | |
| 5,528,056 A | 6/1996 | Shimada et al. | |
| 6,046,638 A | 4/2000 | Hogeboorn | |
| 6,081,218 A | 6/2000 | Ju et al. | |
| 6,278,287 B1 | 8/2001 | Baze | |
| 6,441,663 B1 | 8/2002 | Chuang et al. | |
| 6,784,824 B1 | 8/2004 | Quinn | |
| 6,933,750 B2 | 8/2005 | Takahashi et al. | |
| 7,057,302 B2 * | 6/2006 | Matsuzawa .............. | H01L 27/11 257/216 |
| 7,554,409 B1 | 6/2009 | Zhang et al. | |
| 2002/0016030 A1 | 2/2002 | Misewich et al. | |
| 2003/0049892 A1 | 3/2003 | Yamaguchi et al. | |
| 2003/0210097 A1 | 11/2003 | Wilson et al. | |
| 2003/0214361 A1 | 11/2003 | Nishikido | |
| 2004/0102170 A1 | 5/2004 | Jensen et al. | |
| 2005/0168242 A1 | 8/2005 | Won | |
| 2005/0218299 A1 | 10/2005 | Olsen et al. | |
| 2006/0001413 A1 | 1/2006 | Marinca | |
| 2006/0065927 A1 | 3/2006 | Thean et al. | |
| 2006/0139195 A1 | 6/2006 | Casper et al. | |
| 2007/0046369 A1 | 3/2007 | Schober et al. | |
| 2007/0085593 A1 | 4/2007 | Wich et al. | |
| 2007/0098041 A1 | 5/2007 | Seo | |
| 2007/0252178 A1 | 11/2007 | Onose | |
| 2008/0258959 A1 | 10/2008 | Trifonov et al. | |
| 2009/0160487 A1 | 6/2009 | Hu et al. | |
| 2009/0311837 A1 | 12/2009 | Kapoor | |
| 2011/0309888 A1 | 12/2011 | Bulzacchelli et al. | |
| 2012/0097965 A1 | 4/2012 | Shin et al. | |
| 2012/0098579 A1 | 4/2012 | Schober et al. | |
| 2013/0027107 A1 | 1/2013 | Nohara | |
| 2013/0177175 A1 | 7/2013 | Ting | |
| 2013/0287071 A1 | 10/2013 | Chen et al. | |
| 2014/0062550 A1 | 3/2014 | Lee et al. | |
| 2014/0132435 A1 | 5/2014 | Dempsey | |
| 2014/0159168 A1 | 6/2014 | Toh et al. | |
| 2015/0030102 A1 | 1/2015 | Hormis et al. | |
| 2015/0070091 A1 | 3/2015 | Schober et al. | |
| 2015/0213873 A1 | 7/2015 | Joo et al. | |
| 2017/0040941 A1 | 2/2017 | Chatwin | |
| 2018/0219514 A1 * | 8/2018 | Schober ........... | H03K 19/01856 |
| 2018/0219519 A1 * | 8/2018 | Schober .............. | H03F 3/45183 |
| 2018/0224878 A1 * | 8/2018 | Schober .................. | G05F 3/245 |
| 2018/0226930 A1 * | 8/2018 | Schober .............. | H03F 3/45183 |
| 2018/0308843 A1 | 10/2018 | Schober et al. | |
| 2019/0123688 A1 | 4/2019 | Schober et al. | |

FOREIGN PATENT DOCUMENTS

| | | |
|---|---|---|
| CN | 104465657 | 3/2015 |
| EP | 1079294 | 9/2004 |
| JP | 2014063929 | 4/2014 |
| KR | 1020120043522 | 5/2012 |
| WO | WO9534913 | 12/1995 |
| WO | WO2007014053 | 2/2007 |
| WO | WO2007081634 | 7/2007 |

OTHER PUBLICATIONS

Amaravati, et al., "800-nA Process-and-Voltage-Invariant 106-dB PSRR PTAT Current Reference", IEEE Transactions on Circuits and Systems-II: Express Briefs, Sep. 2013, 60(9), pp. 577-581.
Anusandhana Journal of Science, Engineering and Management, vol. 1, Issue 2, Dec. 2012, 78 pages.
Baghini, et al., "A Sub-1V 32nA Process, Voltage and Temperature Invariant Voltage Reference Circuit", 2013 26th International Conference on VLSI Design and the 12th International Conference on Embedded Systems, 2013, pp. 136-141.
Baker, et al., "High Speed Op-amp Design: Compensation and Topologies for Two and Three Stage Designs", IEEE Solid-State Circuits Society, Apr. 9-10, 2015, 58 pages.
Baker, R. Jacob, "CMOS—Circuit Design, Layout, and Simulation, Third Edition", IEEE Press, 2010.
Bendali, et al., "A 1-V CMOS Current Reference With Temperature and Process Compensation", IEEE Transactions on Circuits and Systems-I: Regular Papers, vol. 54, No. 7, Jul. 2007, pp. 1424-1429.
Christoffersen, et al., "An Ultra-Low Power CMOS PTAT Current Source", IEEE-EMATA 2010, pp. 35-40.
Dai, et al., "Threshold Voltage Based CMOS Voltage Reference", IEE Proceedings Circuits Devices Systems, vol. 151, No. 1, Feb. 2004, pp. 58-62.
De Vita, et al., "A 300 nW, 12 ppm/C Voltage Reference in a Digital 0.35 um CMOS Process", 2006 Symposium on VLSI Circuits Digest of Technical Papers, IEEE 2006, 3 pages.
Galeano et al., "A Very Low Power Area Efficient CMOS Only Bandgap Reference", IEEE 2012, 6 pages.
Gray, et al., "Analysis and Design of Analog Integrated Circuits", John Wiley & Sons, Inc., 2009.
Haft-Baradaran, Afshin, "Basic and Advanced Current References", University of Toronto, 2001, 16 pages.
Hirose, et al., "A CMOS Bandgap and Sub-Bandgap Voltage Reference Circuits for Nanowatt Power LSIs", IEEE Asian Solid-State Circuits Conference, Nov. 8-10, 2010, 4 pages.
Horowitz, et al., "The Art of Electronics—2nd Edition", Cambridge University Press, 1989, 1041 pages.
Huang, et al., "A 1V 16.9ppm/C 250nA Switched-Capacitor CMOS Voltage Reference", 2008, IEEE International Solid-State Circuits Conference, 4 pages.
Huang, et al., "Piecewise Linear Curvature-Compensated CMOS Bandgap Reference", IEEE, 2008, pp. 308-311.
Huffenus, et al., "A High PSRR Class-D Audio Amplifier IC Based on a Self-Adjusting Voltage Reference", European Solid State Circuits Conference, 2010, pp. 4.
PCT Search Report and Written Opinion dated Oct. 23, 2015 for PCT Applicatoin No. PCT/US2015/42696, 12 pages.
International Search Report and Written Opinion from PCT/US2016/044770, dated Nov. 10, 2016, 13 pages.
International Search Report and Written Opinion from PCT/US2016/044787, dated Nov. 8, 2016, 14 pages.
International Search Report and Written Opinion from PCT/US2016/044792, dated Oct. 20, 2016, 11 pages.
PCT Search Report and Written Opinion dated May 13, 2016 for PCT Application No. PCT/US2016/14639, 11 pages.

(56) References Cited

OTHER PUBLICATIONS

PCT Search Report and Written Opinion dated Mar. 13, 2017 for PCT Application No. PCT/US2016/44800, 10 pages.
PCT Search Report and Written Opinion dated Apr. 3, 2017 for PCT application No. PCT/US2016/67529, 14 pages.
Ivanov, et al., "An Ultra Low Power Bandgap Operational at Supply From 0.75 V", IEEE Journal of Solid-State Circuits, vol. 47, No. 7, Jul. 2012, pp. 1515-1523.
Le, et al., "A Design of Three-Stage CMOS Opamp Using Indirect Feedback Compensation Technique", The Solid-State Systems Symposium & VLSI and Related Technology, 4S, Aug. 2012, pp. 153-156.
Lee, et al., "A Wideband CMOS Variable Gain Amplifier With an Exponential Gain Control", IEEE Transactions on Microwave Theory and Techniques, vol. 55, No. 6, Jun. 2007, pp. 1363-1373.
Mattia, et al., "2.3 ppm/C 40 nW MOSFET-Only Voltage Reference", ISLPED' 14, Aug. 11-13, 2014, 7 pages.
Meijer, et al., "Temperature Sensors and Voltage References Implemented in CMOS Technology", IEEE Sensors Journal, vol. 1, No. 3, Oct. 2001, pp. 225-234.
Millemon Sr., "CMOS Characterization, Modeling, and Circuit Design in the Presence of Random Local Variation", A Thesis submitted Aug. 2012, Boise State University, 88 pages.
Mok, et al., "Design Considerations of Recent Advanced Low-Voltage Low-Temperature-Coefficient CMOS Bandgap Voltage Reference", CICC, Oct. 2004, 8 pages.
Final Office Action dtd Mar. 6, 2019 for U.S. Appl. No. 15/545,200 "Phase Frequency Detector and Accurate Low Jitter High Frequency Wide-Band Phase Lock Loop" Schober, 8 pages.
Office Action for U.S. Appl. No. 15/545,200 dated Oct. 1, 2018, Schober et al, "Phase Frequency Detector and Accurate Low Jitter High Frequency Wide-Band Phase Lock Loop", 6 pages.
Office Action for U.S. Appl. No. 15/748,813, dated Oct. 18, 2018, Schober et al., Low Noise Trans-Impedance Amplifiers Based on Complementary Current Field-Effect Transistor Devices, 14 pages.
Osaki, et al., "1.2-V Supply, 100-nW, 1.09-V Bandgap and 0.7-V Supply, 52.5-nW, 0.55-V Subbandgap Reference Circuits for Nanowatt CMOS LSIs", IEEE Journal of Solid-State Circuits, vol. 48, No. 6, Jun. 2013, pp. 1530-1538.
Pain, et al., "Low-power Low-noise Analog Circuits for on-focal-plane Signal Processing of Infrared Sensors", Proceedings of the SPIE, vol. 1946, 1993, 10 pages.
Park, et al., "A 95nW Ring Oscillator-based Temperature Sensor for RFID Tags in 0.13um CMOS", IEEE 2009, pp. 1153-1156.
Paul, et al., "Design of Second-Order Sub-Bandgap Mixed-Mode Voltage Reference Circuit for Low Voltage Applications", Proceedings of the 18th Intl Conference on VLSI Design, 2005, 6 pages.
Razavi, B., Design of Analog CMOS Integrated Circuits, 2001, McGraw-Hill Higher Education, New York, NY.
Razavi, B., Fundamentals of Microelectronics, Wiley, 2006.
Rossi, et al., "PTAT Voltage Generator Based on an MOS Voltage Divider", 2007, Instituto de Ing. Electrica, Universidad de la Republica, Montevideo, Uruguay, 4 pages.
Rossi, et al., "Ultra-low Power CMOS Cells for Temperature Sensors", SBCCI '05, Sep. 4-7, 2005, pp. 202-206.
Rossi-Aicardi, et al., "A MOSFET-only Voltage Source with Arbitrary Sign Adjustable Temperature Coefficient", IEEE 2011, pp. 366-369.
Saxena, et al., "Compensation of CMOS Op-amps Using Split-Length Transistors", IEEE 2008, pp. 109-112.
Saxena, et al., "Indirect Compensation Technique for Low-Voltage CMOS Op-amps", Jan. 18, 2016, 4 pages.
Saxena, et al., "Indirect Feedback Compensation of CMOS Op-Amps ", 2006 IEEE Workshop on Microelectronics and Electron Devices, 2 pages.
Saxena, et al., "Systematic Design of Three-Stage Op-amps Using Split-Length Compensation", 2011, IEEE 54th International Midwest Symposium on Circuits and Systems (MWSCAS), pp. 1-4.
Saxena, Vishal, "Indirect Feedback Compensation Techniques for Mulit-Stage Operational Amplifiers", A Thesis submitted Oct. 2007, Boise State University, 209 pages.
Schmitt, Otto H., "A Simple Differential Amplifier", R.S.I., vol. 8, Apr. 1937, pp. 126-127.
Schmitt, Otto H., "A Thermionic Trigger", Journal of Scientific Instrumens, 1937, 3 pages.
Shinde, S.V., "PVT Insensitive Reference Current Generation", Proceedings of the International MultiConference of Engineers and Computer Scientists 2014, vol. II, Mar. 12-14, 2014, 5 pages.
Sun, et al., "A Low-Power Low-Voltage Bandgap Reference in CMOS", CCECE 2010 Canadian Conference, 5 pages.
Tzanateas et al., "A CMOS Bandgap Voltage Reference", IEEE Journal of SolidD-State Circuits, vol. SC-14, No. 3, Jun. 1979, pp. 655-657.
Vittoz, et al., "A Low-Voltage CMOS Bandgap Reference", IEEE Journal of Solid-State Circuits, Vovl. SC-14, No. 3, Jun. 1979, pp. 573-577.
Vittoz, et al., "CMOS Analog Integrated Circuits Based on Weak Inversion Operation", IEEE Journal of Solid-State Circuits, Jun. 1977, vol. SC-12, No. 3, pp. 224-231.
Yang, et al., "All-CMOS Subbandgap Reference Circuit Operating at Low Supply Voltage", IEEE 2011, pp. 893-896.
Zhang, Z., "CMOS Radio Frequency Integrated Circuit Design for Direct Conversion Receivers", A thesis submitted to The Hong Kong University of Science and Technology, Sep. 2001, 155 pages.
Ajit et al., "The Minority Carrier Injection Controlled field-Effect Transistor (MICFET): A New MOS-Gate Power Transistor Sturcture", IEEE Transactions on Electron Devices, vol. 39, No. 8, Aug. 1992, 7 pages.
Baker et al., "High Speed Op-amp Design: Compensation and Topologies for Tow and three Stage Designs", Jul. 1, 2007, retrieved Jun. 6, 2006 from «http://cmosedu.com/jbaker/papers/talks/Multistage_Opamp_Presentation.pdf», 58 pages.
Office Action from related Chinese Application No. 201580083441.5 dated Apr. 26, 2019, 6 pages.
The Extended European Search Report dated Jun. 28, 2019 for European Patent Application No. 15899854.2, 7 pages.
Sugawara, et al., 350 V Carrier Injection Field Effect Transistor (CIFET) with Very Low On-Resistance and High Switching Speed, Proceedings of the 7th International Symposium on Power Semiconductor Devices and IC's, May 23, 1995, 5 pages.
Office Action from related Chinese Application No. 201680056648.8 dated Aug. 2, 2019, 6 pages.

* cited by examiner

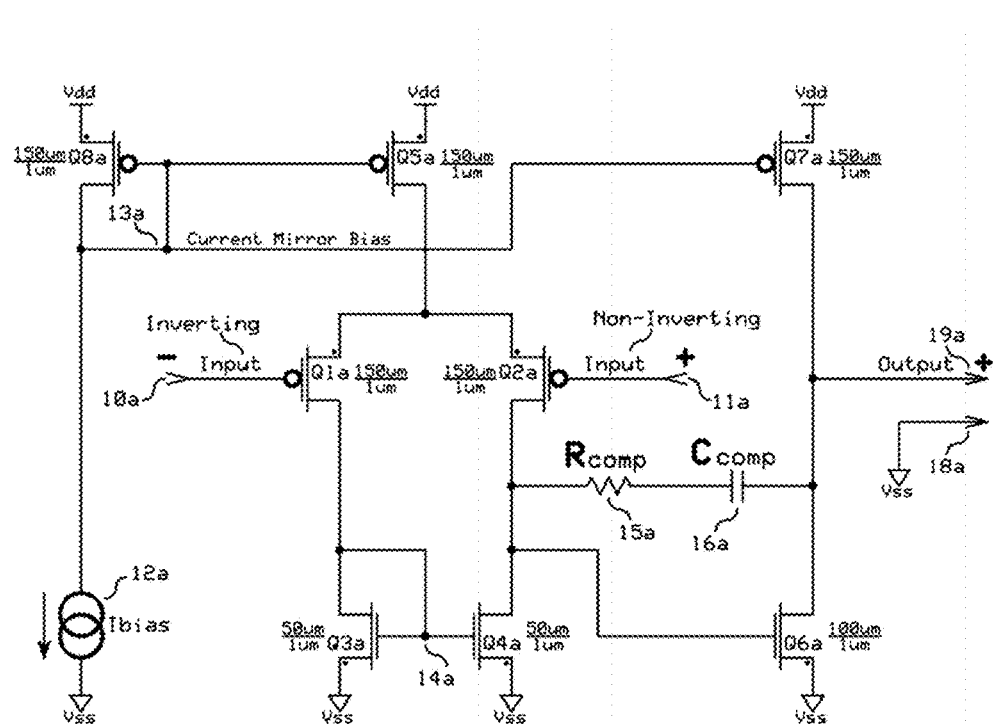
PRIOR ART
Figure 1a

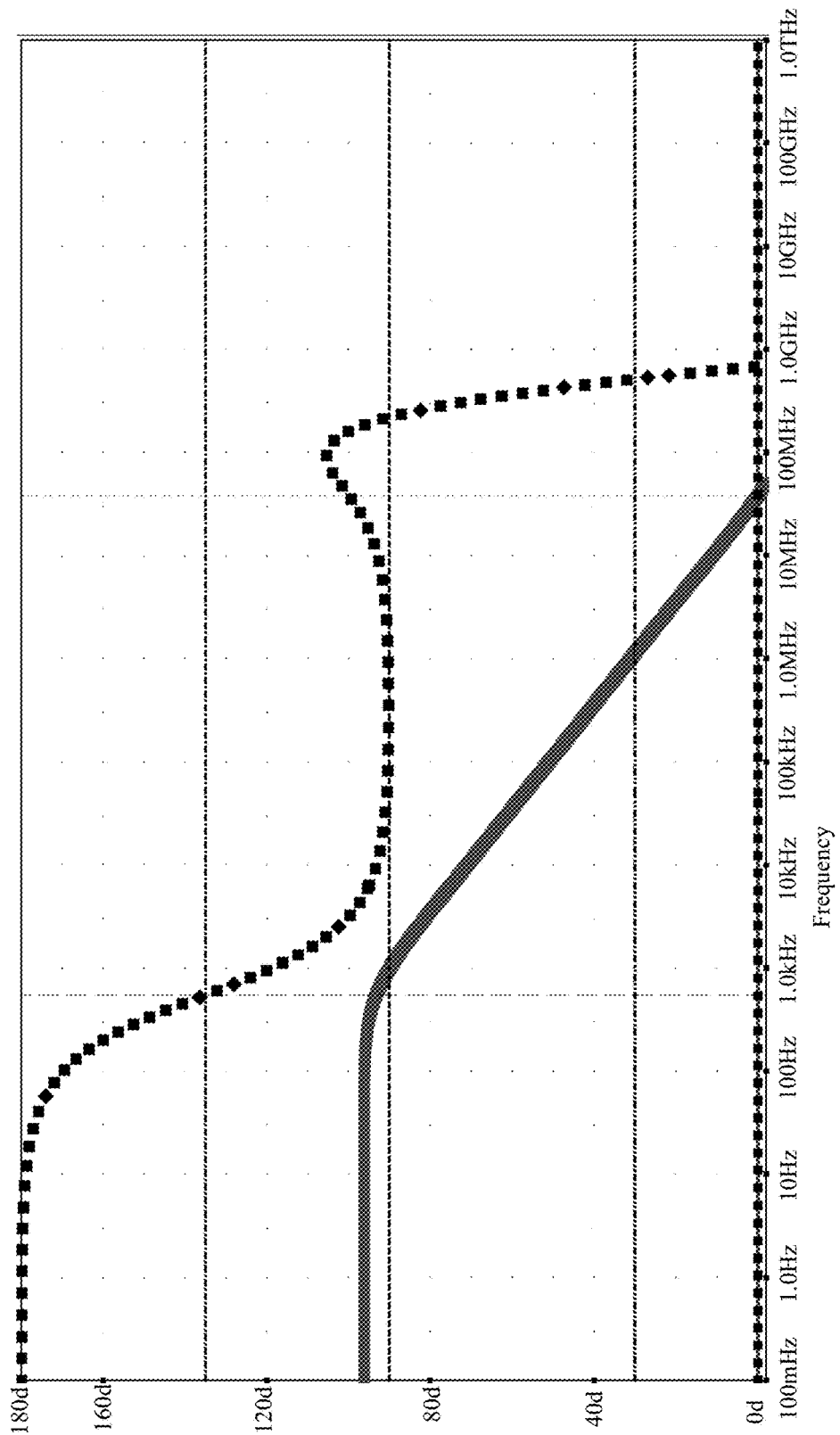
PRIOR ART
Figure 1b

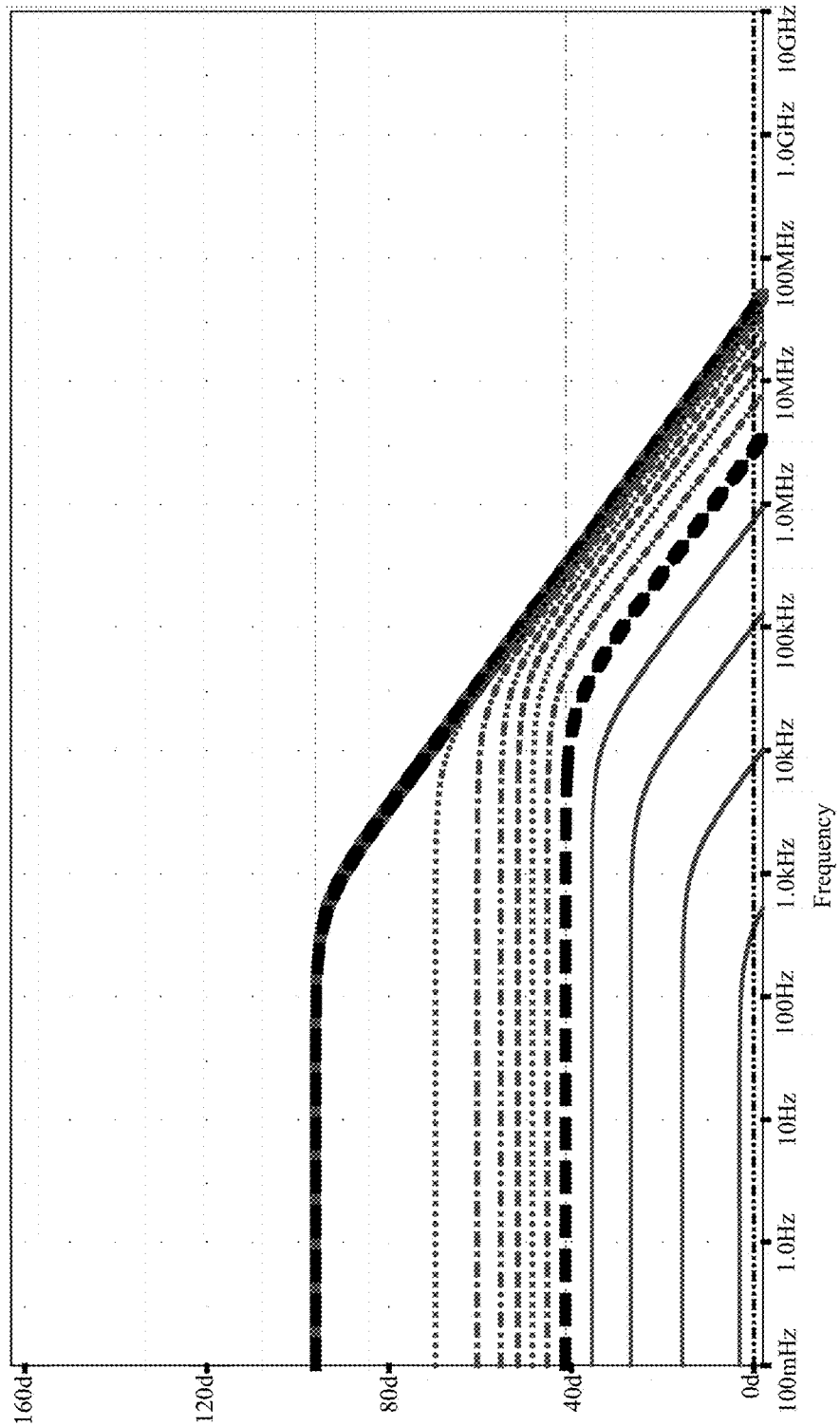
PRIOR ART
Figure 1c

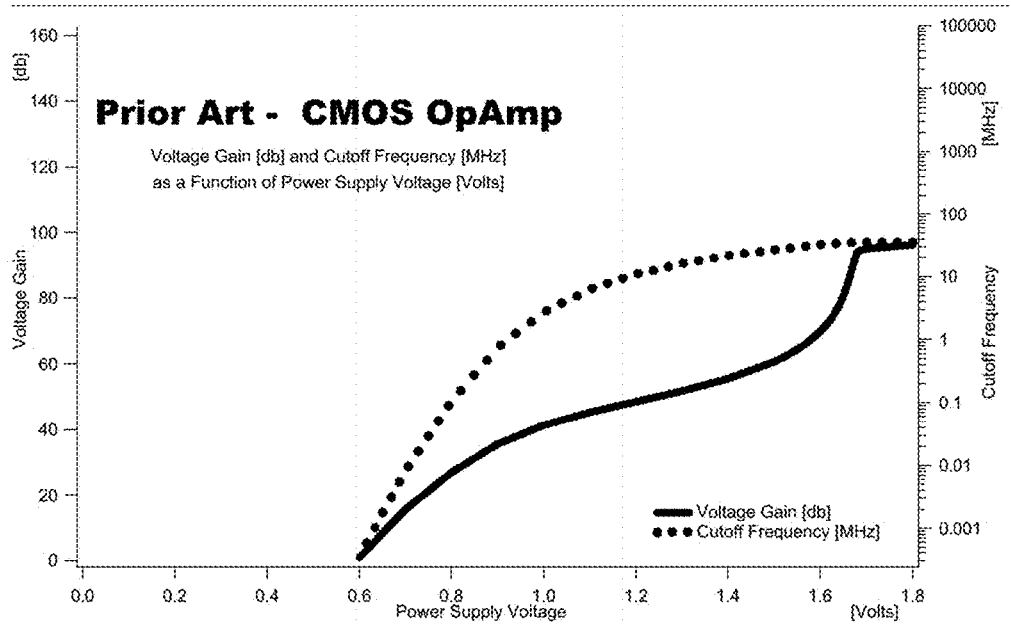
Figure 1d
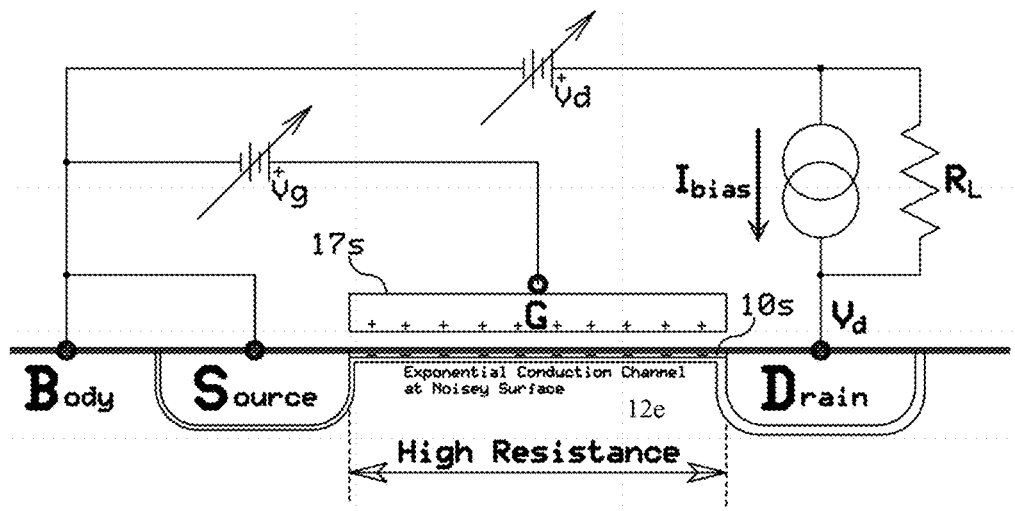
PRIOR ART
Figure 1e

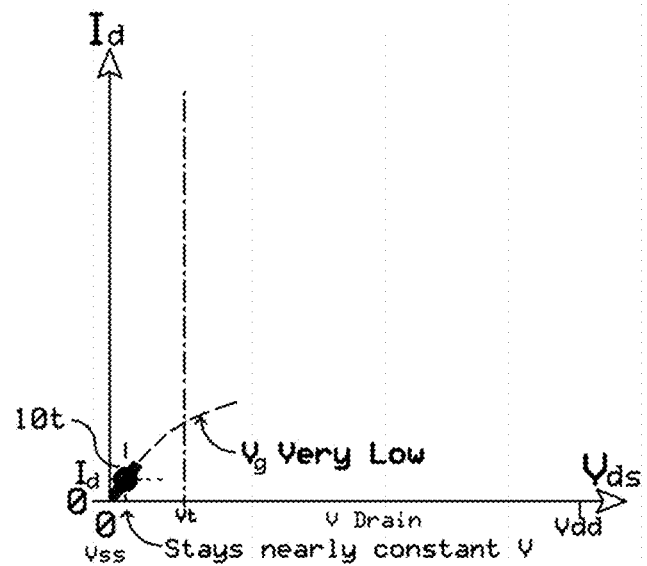
PRIOR ART
Figure 1f
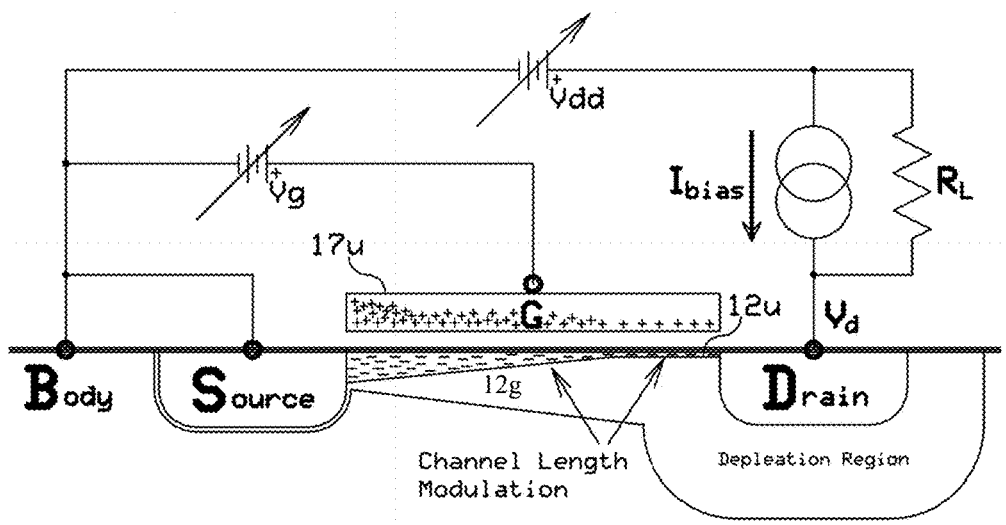
PRIOR ART
Figure 1g

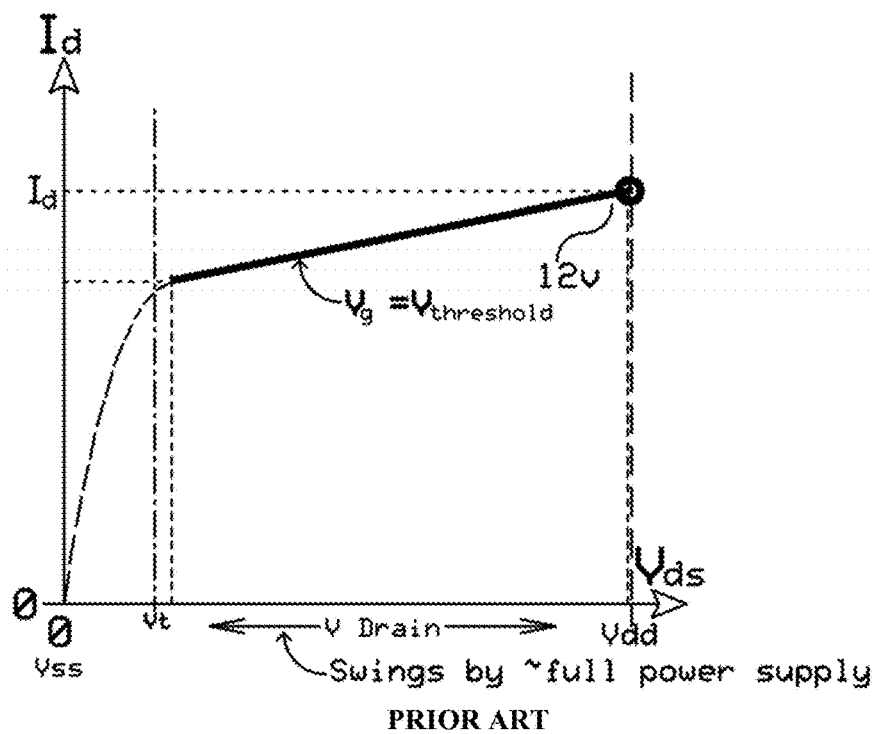
PRIOR ART
Figure 1h
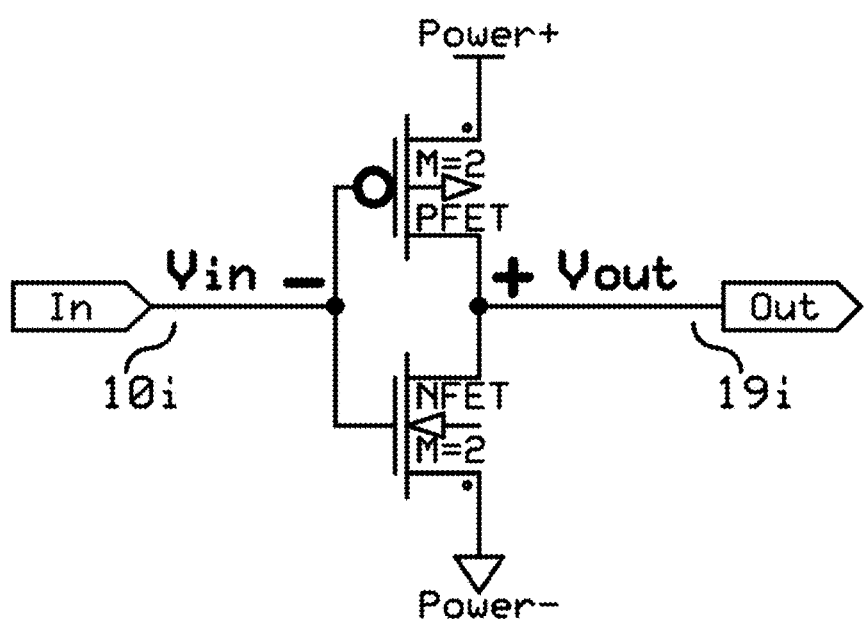
PRIOR ART
Figure 1i

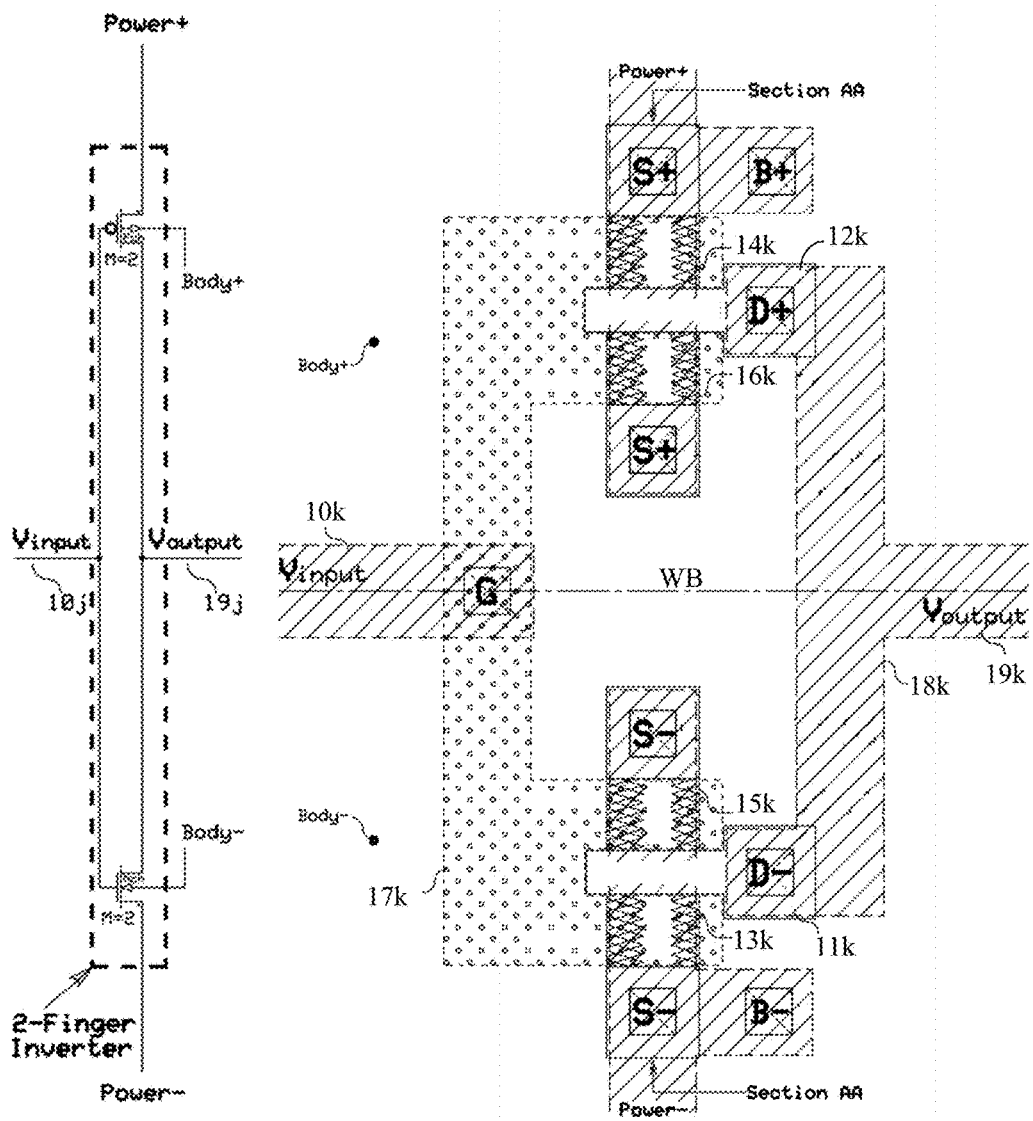
PRIOR ART
Figure 1j
PRIOR ART
Figure 1k

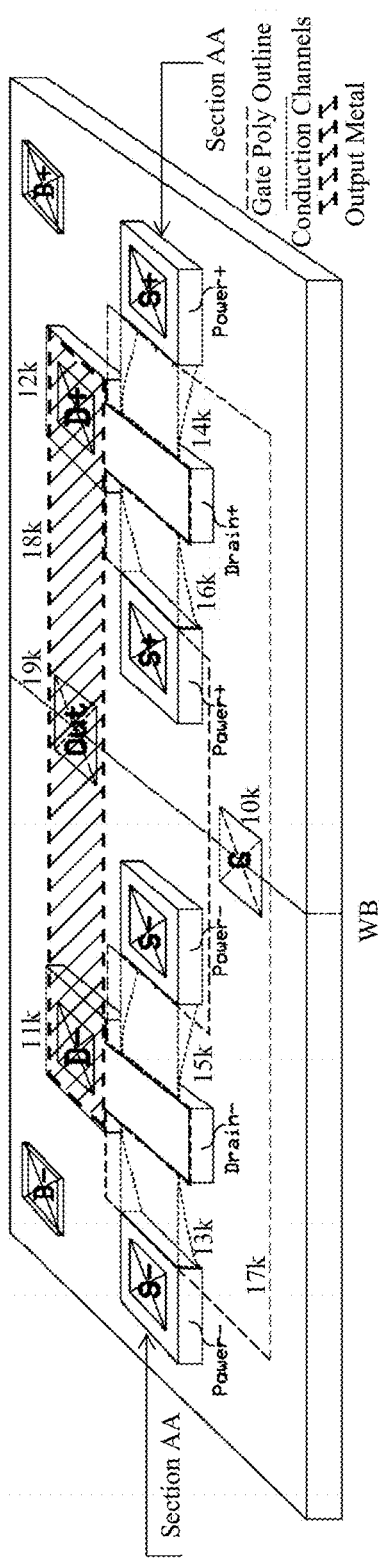
PRIOR ART
Figure 1m
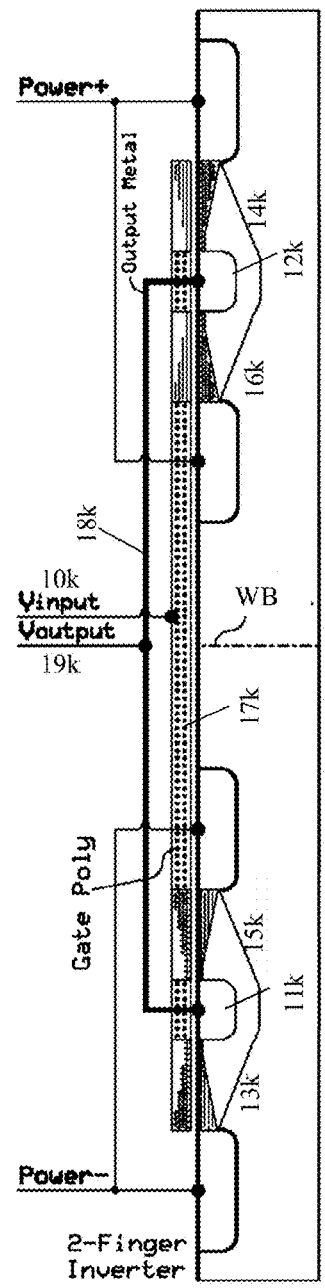
PRIOR ART
Figure 1n

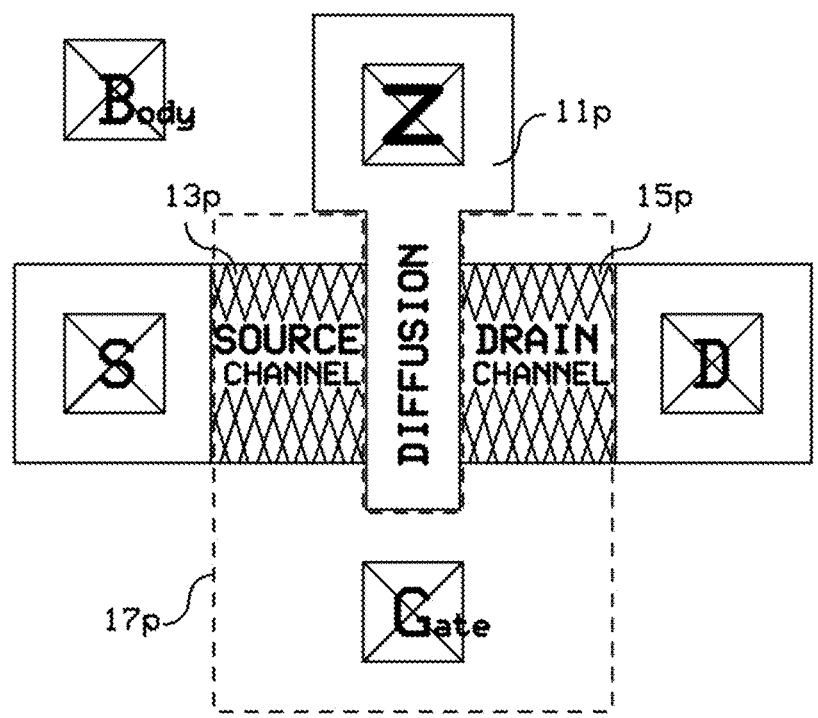
PRIOR ART
Figure 1p

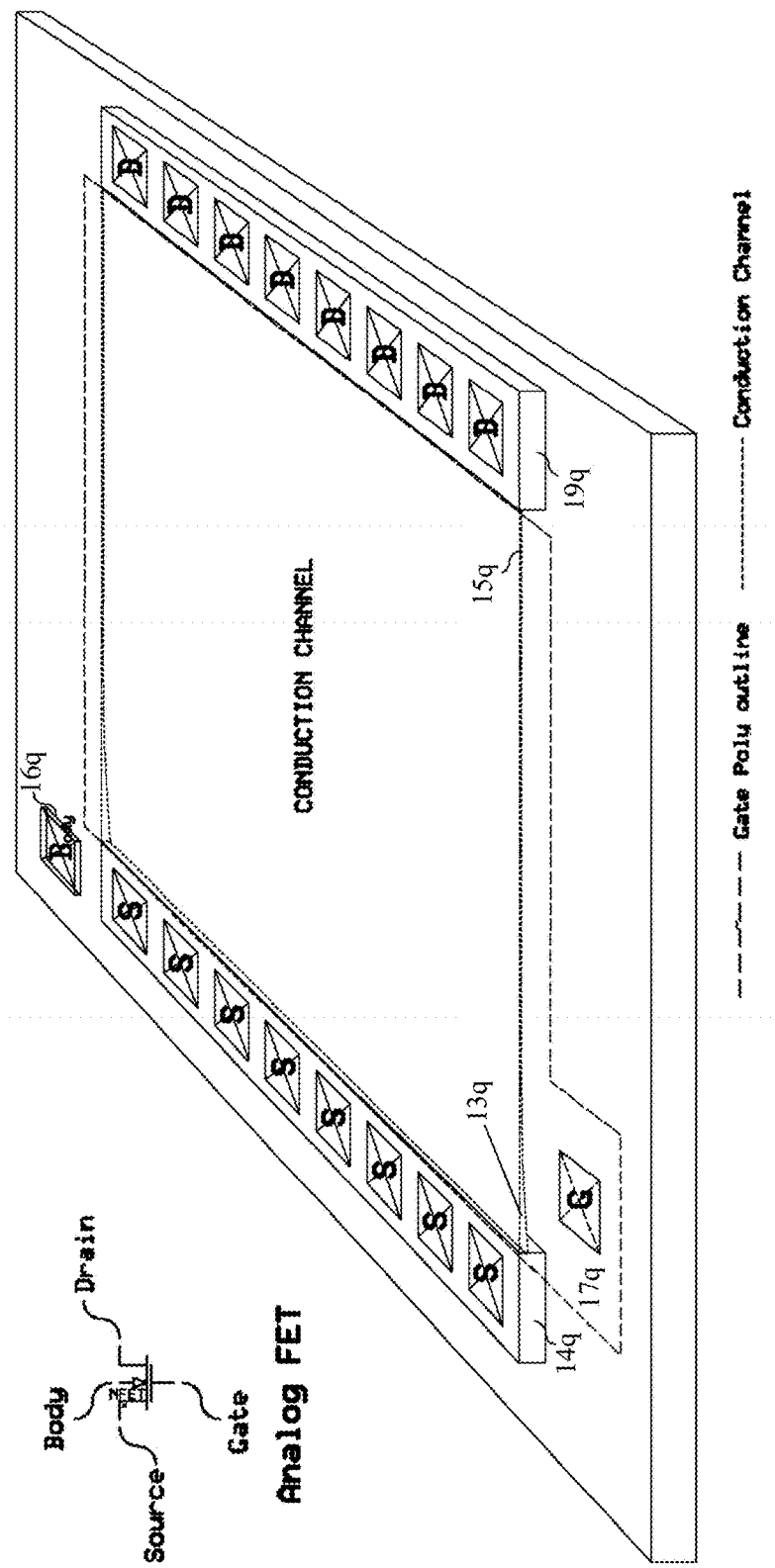
PRIOR ART
Figure 1q

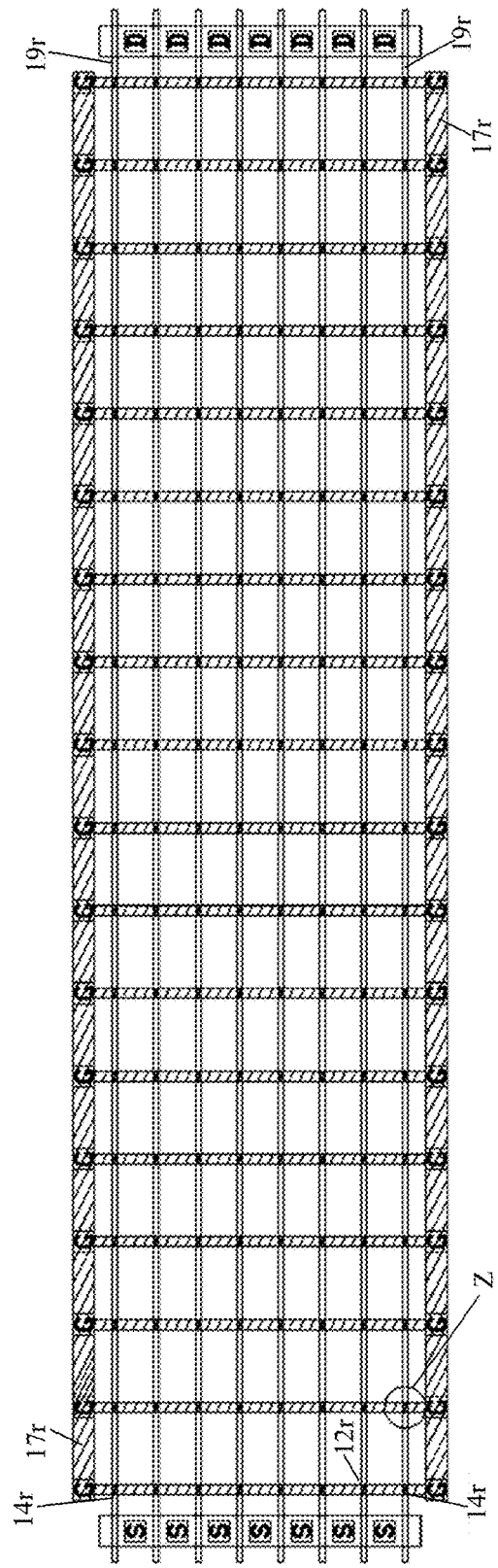
PRIOR ART
Figure 1r

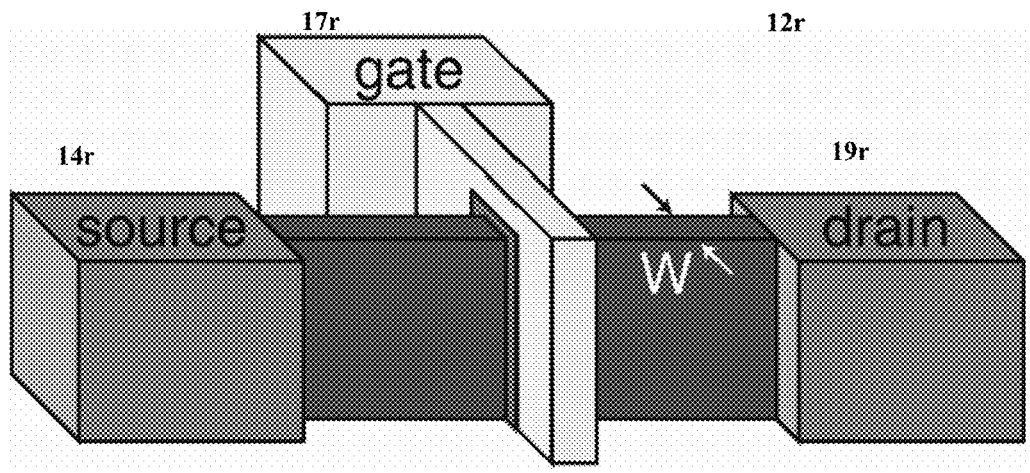
PRIOR ART
Figure 1s
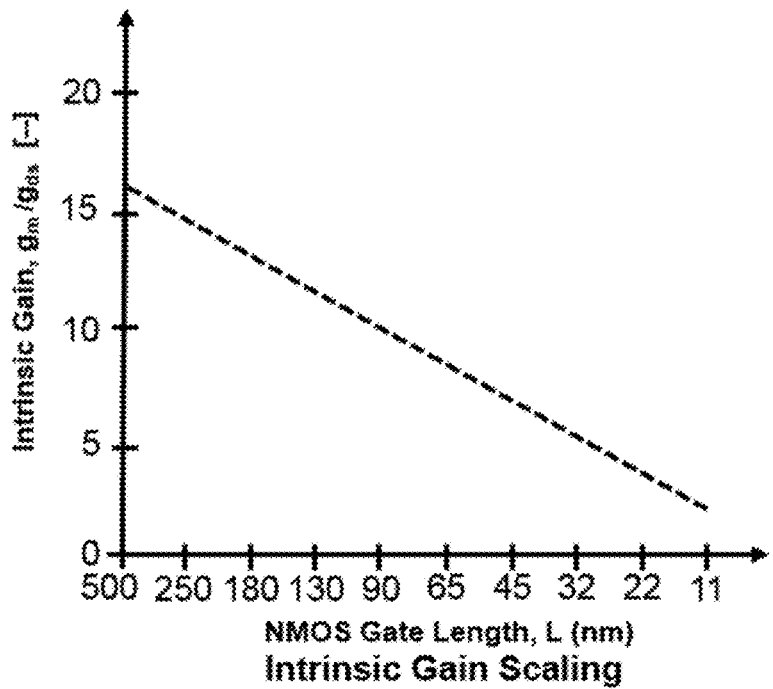
PRIOR ART
Figure 1t

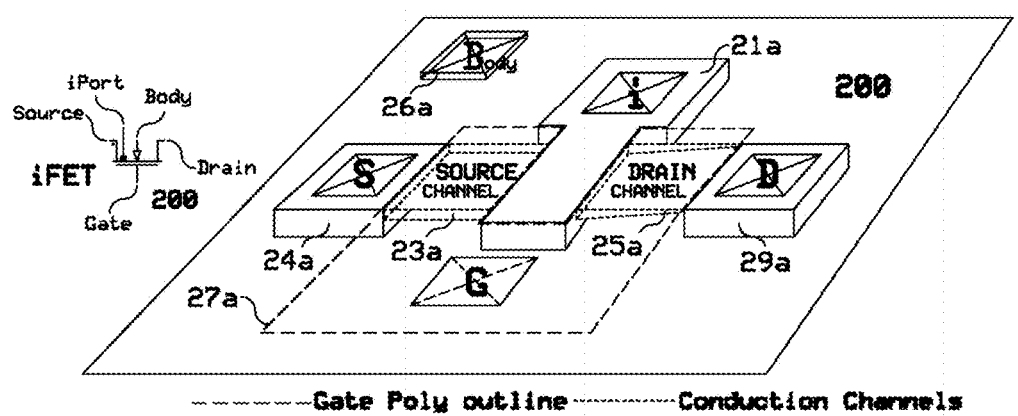
Figure 2a
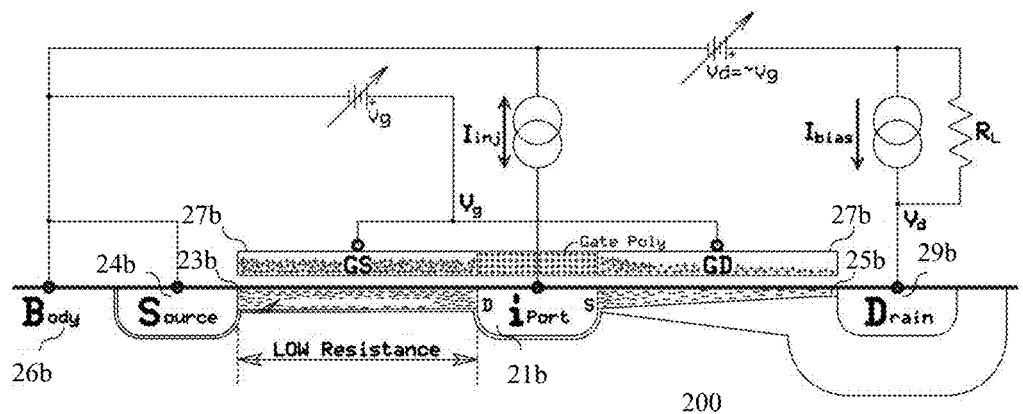
Figure 2b

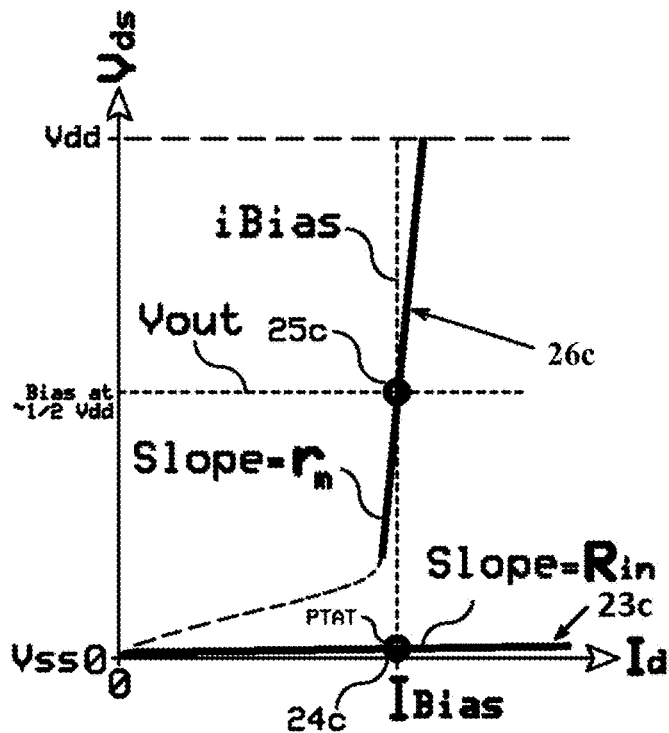
Figure 2c
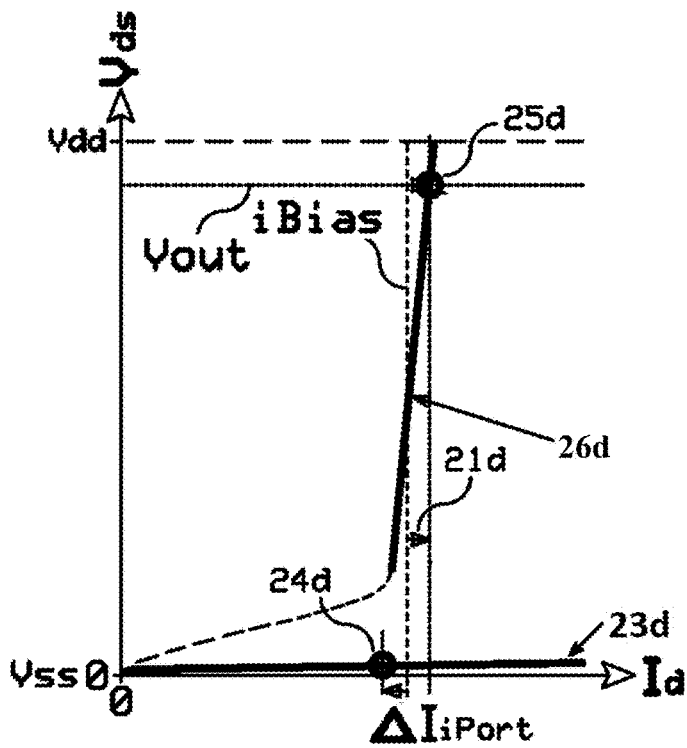
Figure 2d

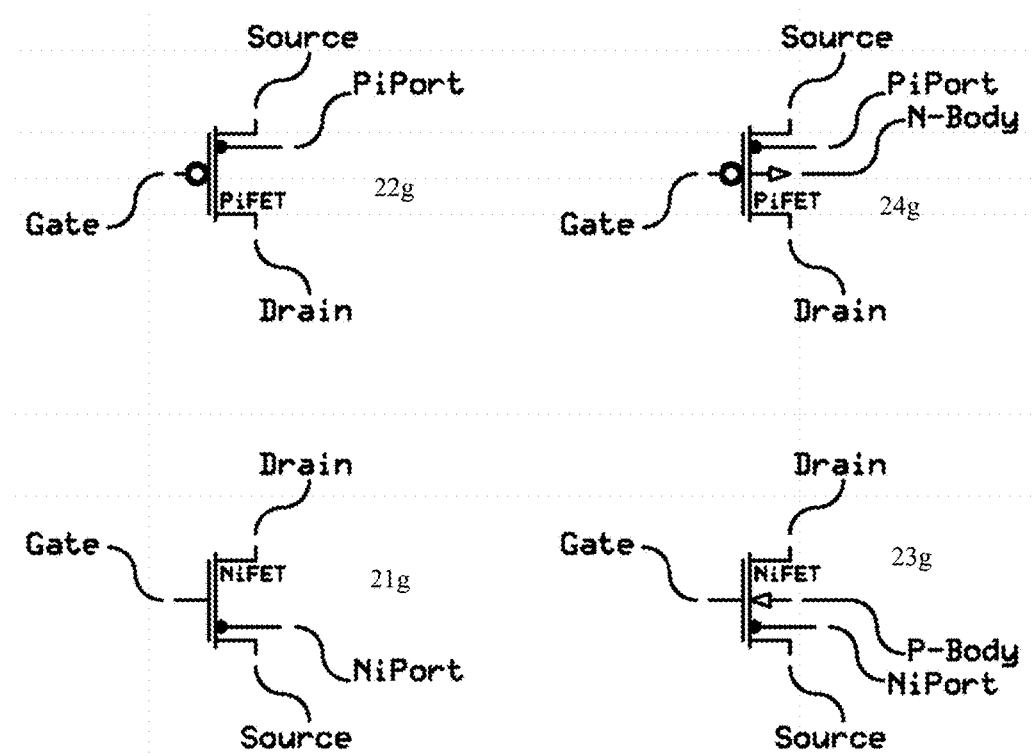
Figure 2e

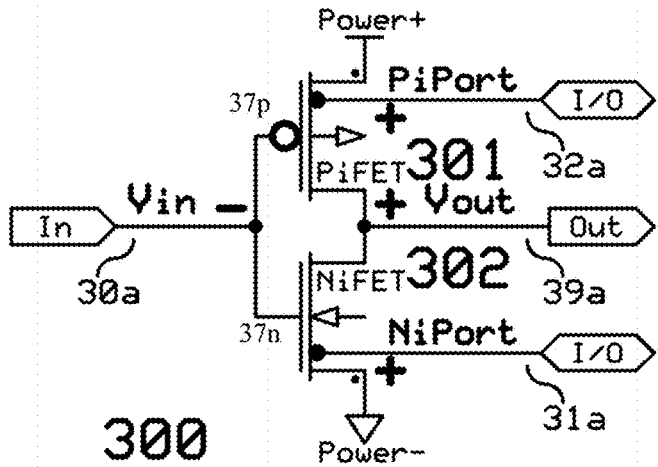
Figure 3a
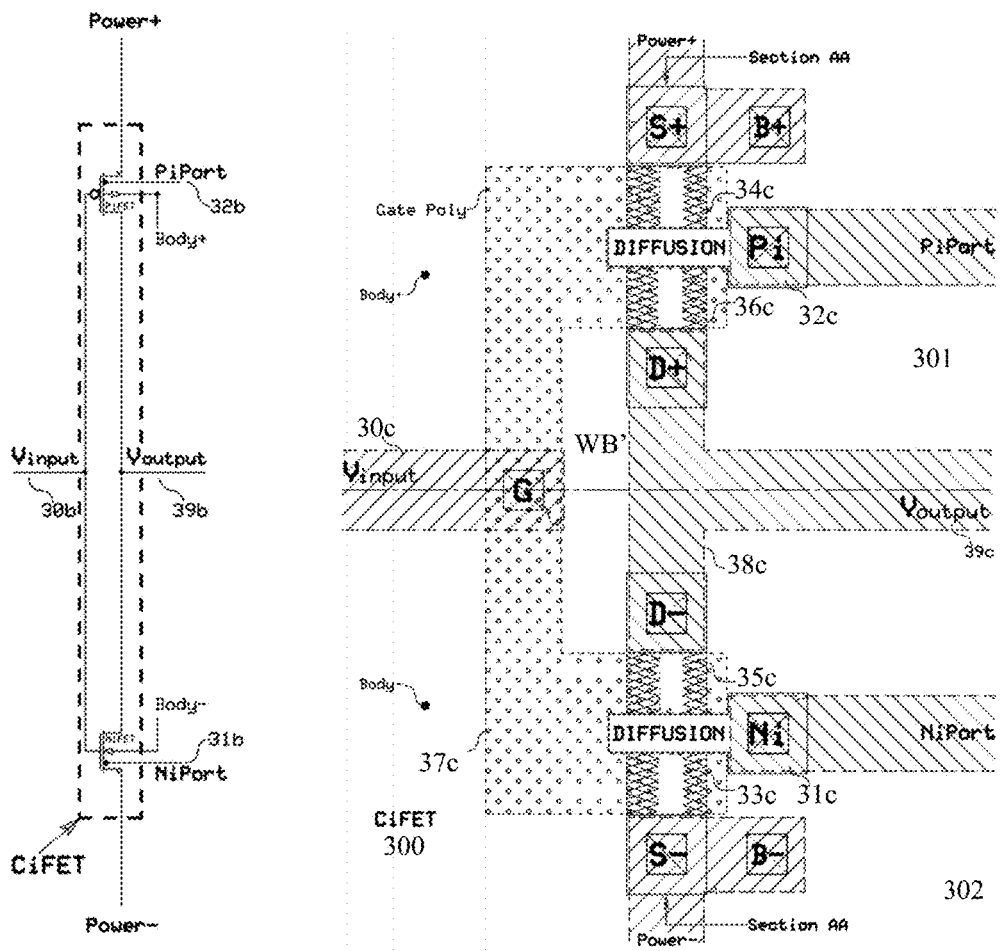
Figure 3b
Figure 3c

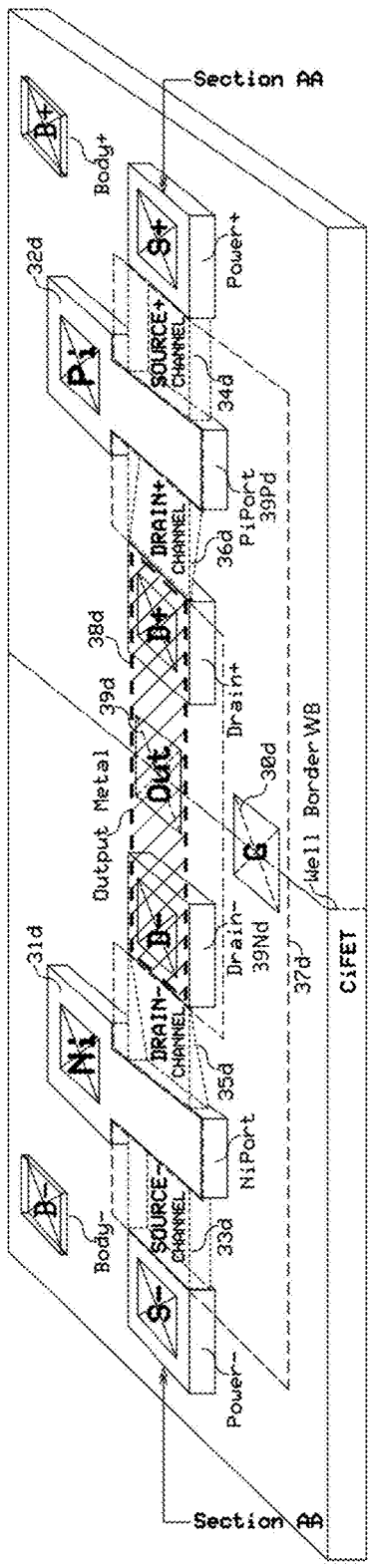
Figure 3d
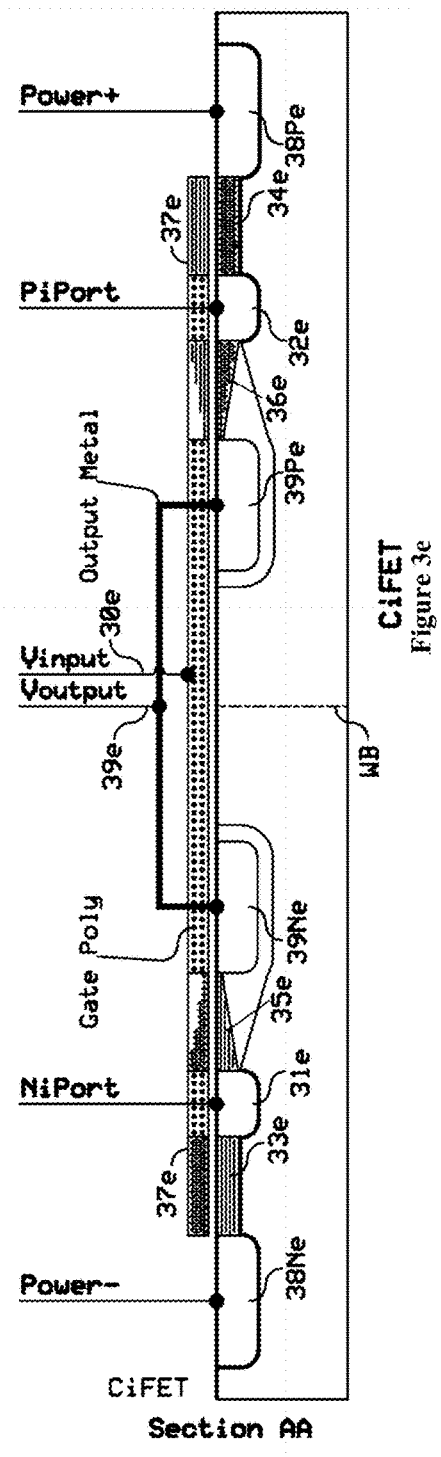
CiFET
Figure 3e

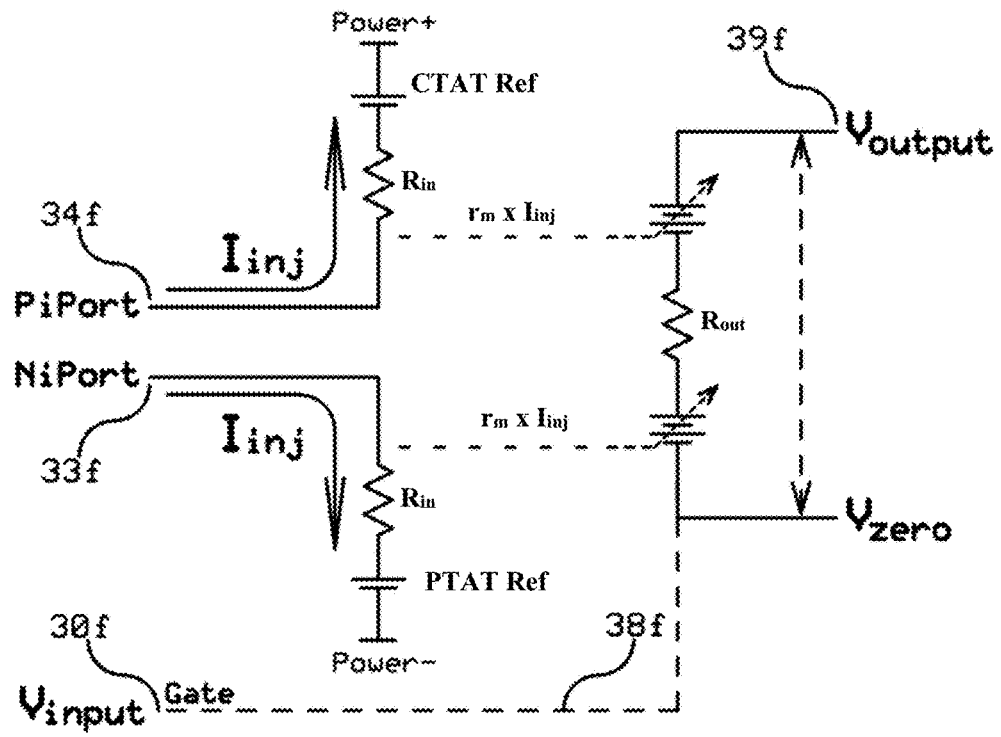
Figure 3f
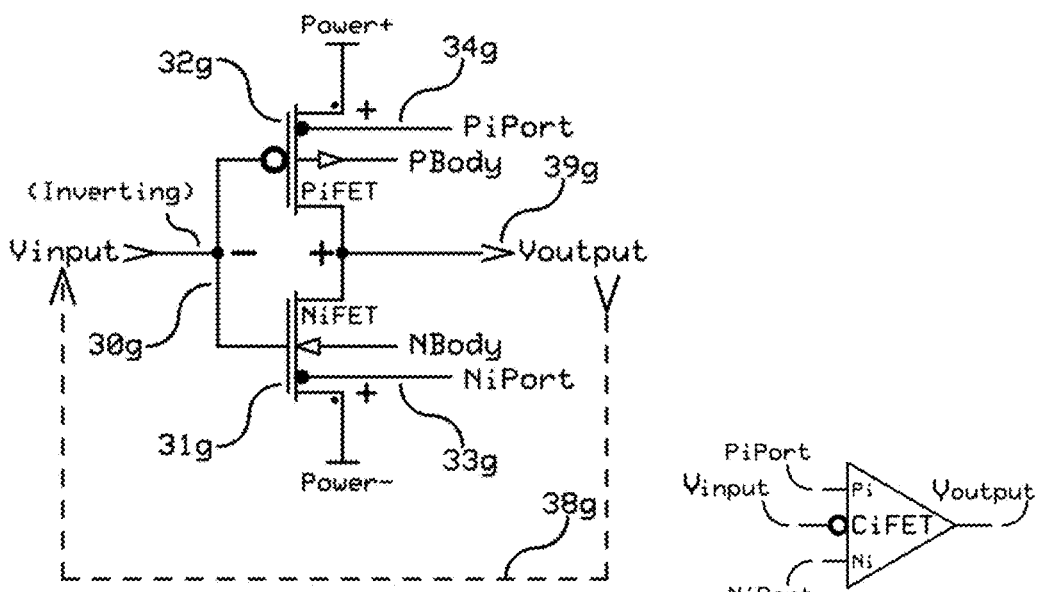
Figure 3g
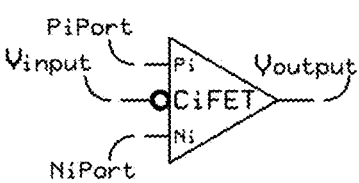
Figure 3h

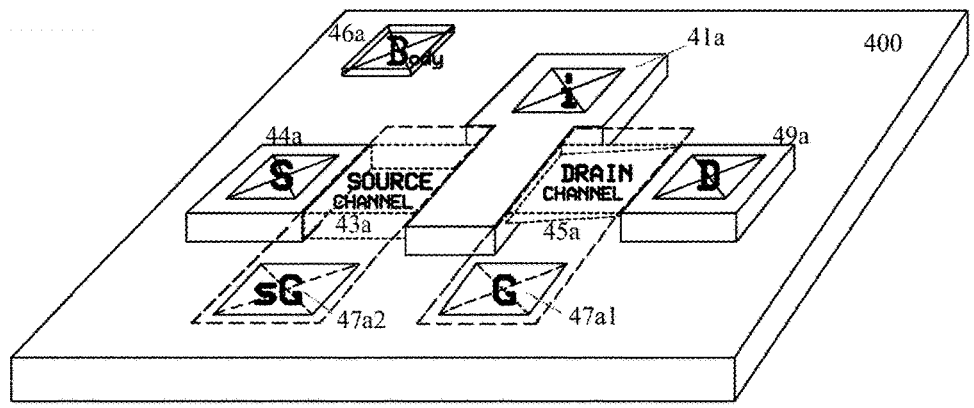
Figure 4a
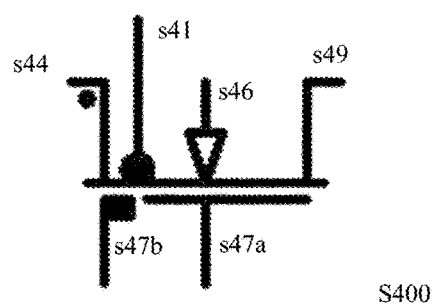
Figure 4b
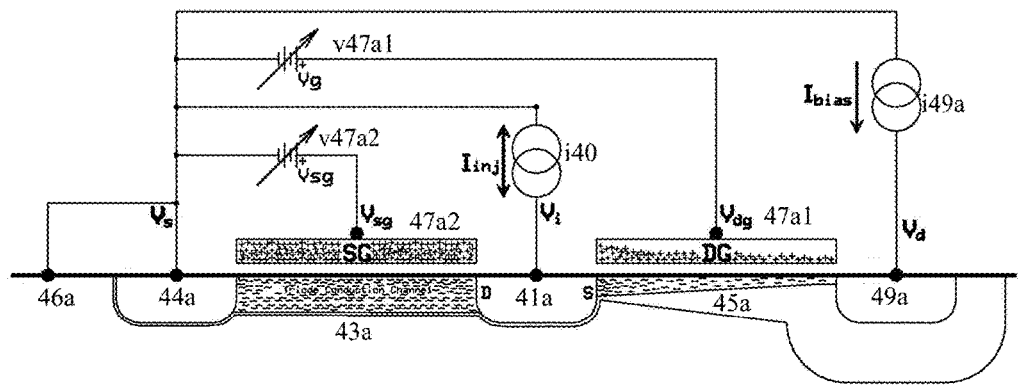
Figure 4c

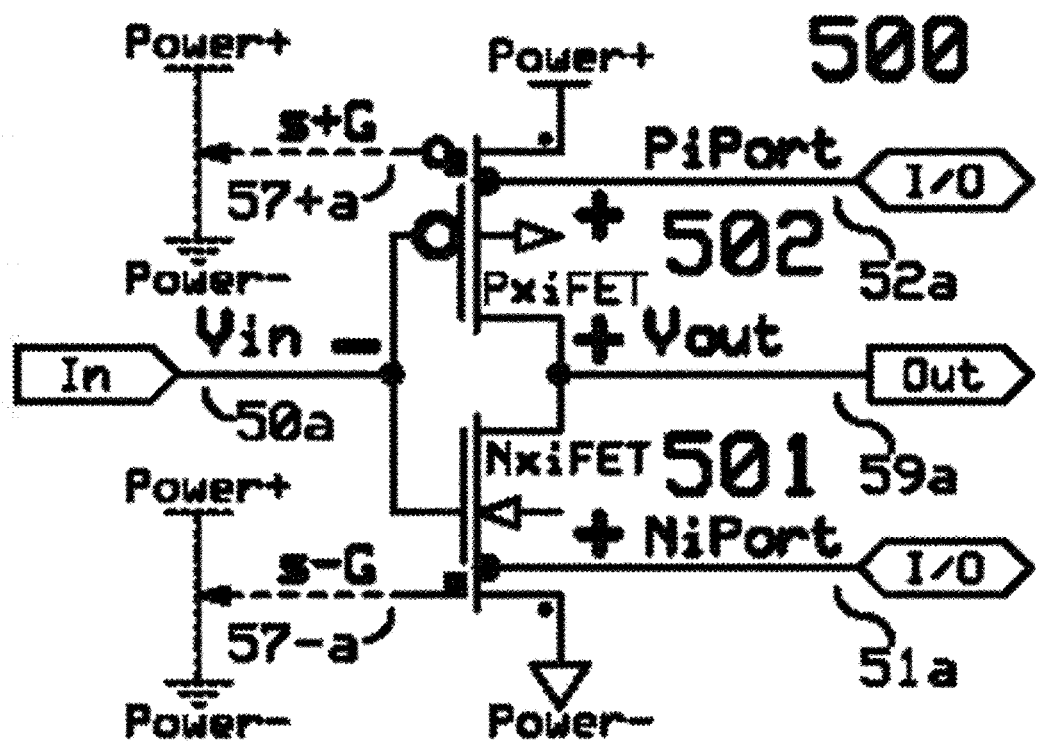
Figure 5

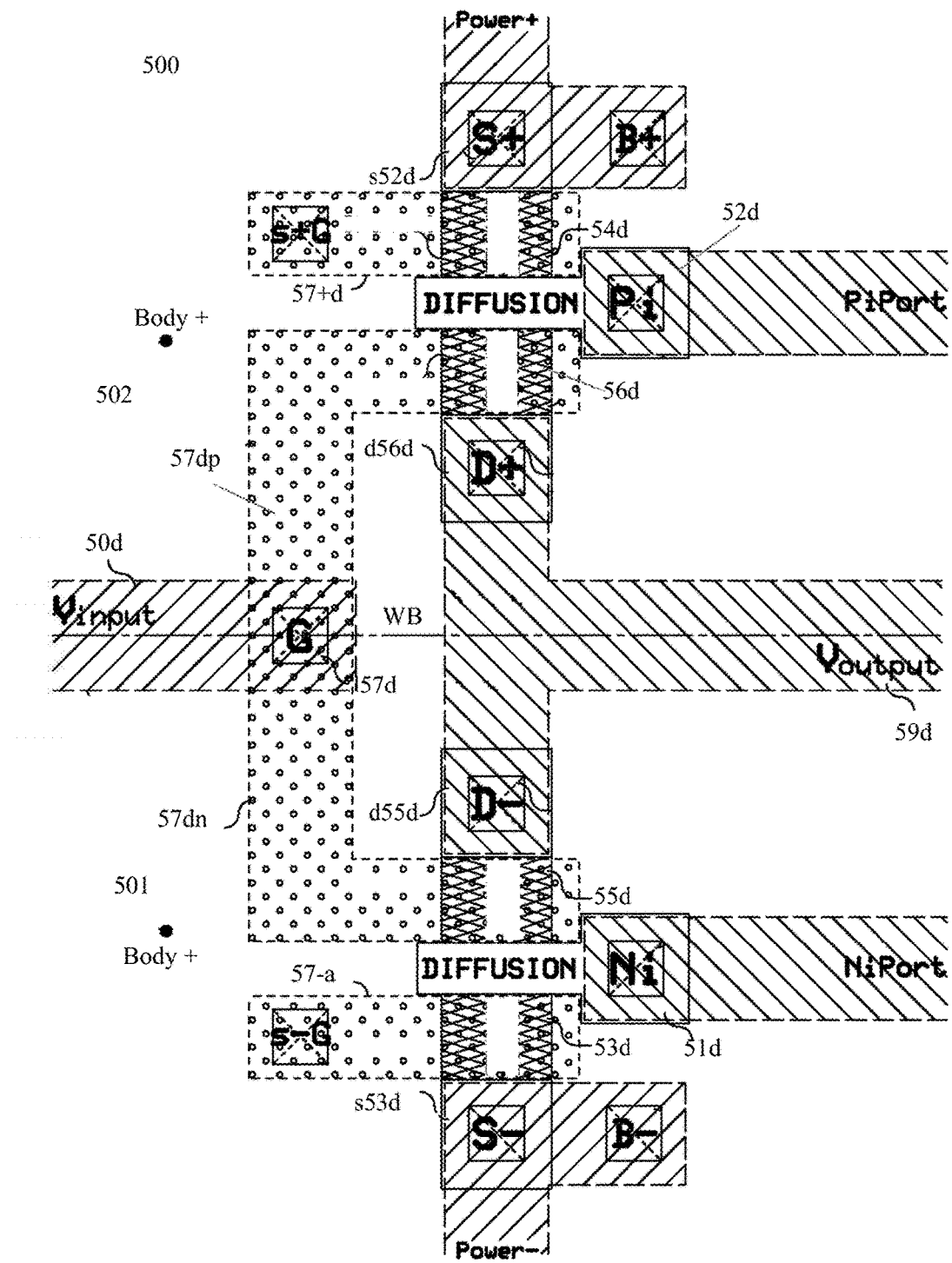
Figure 6

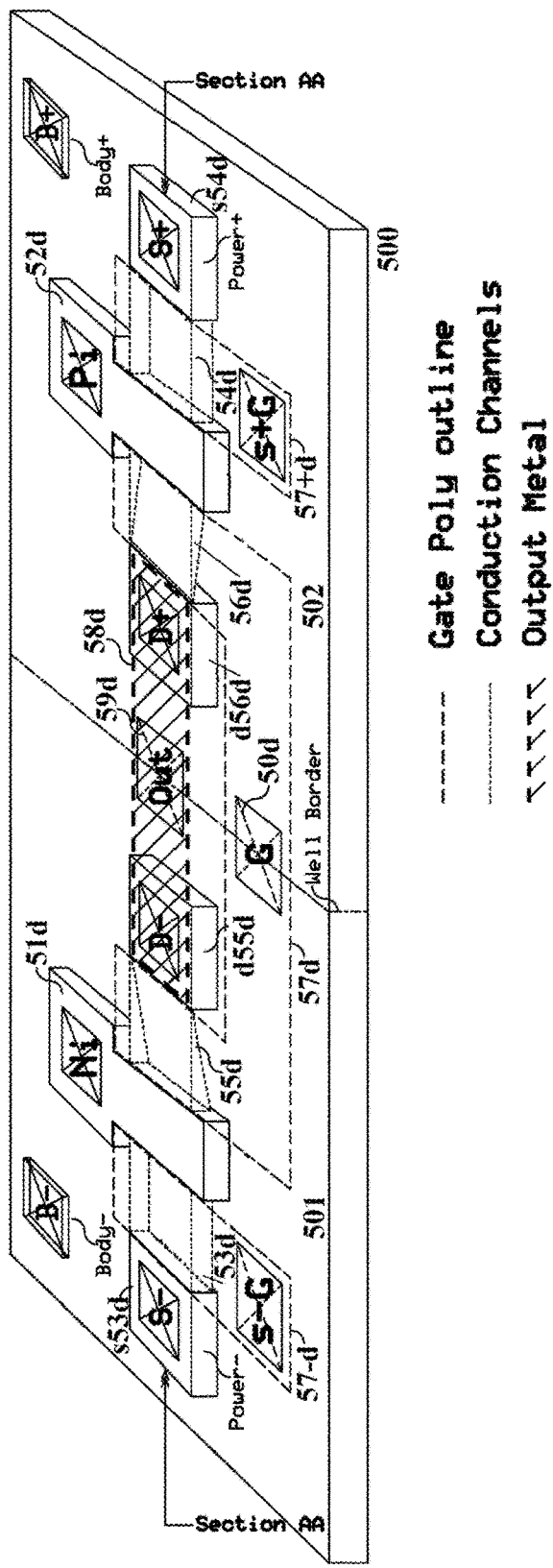
Figure 7a

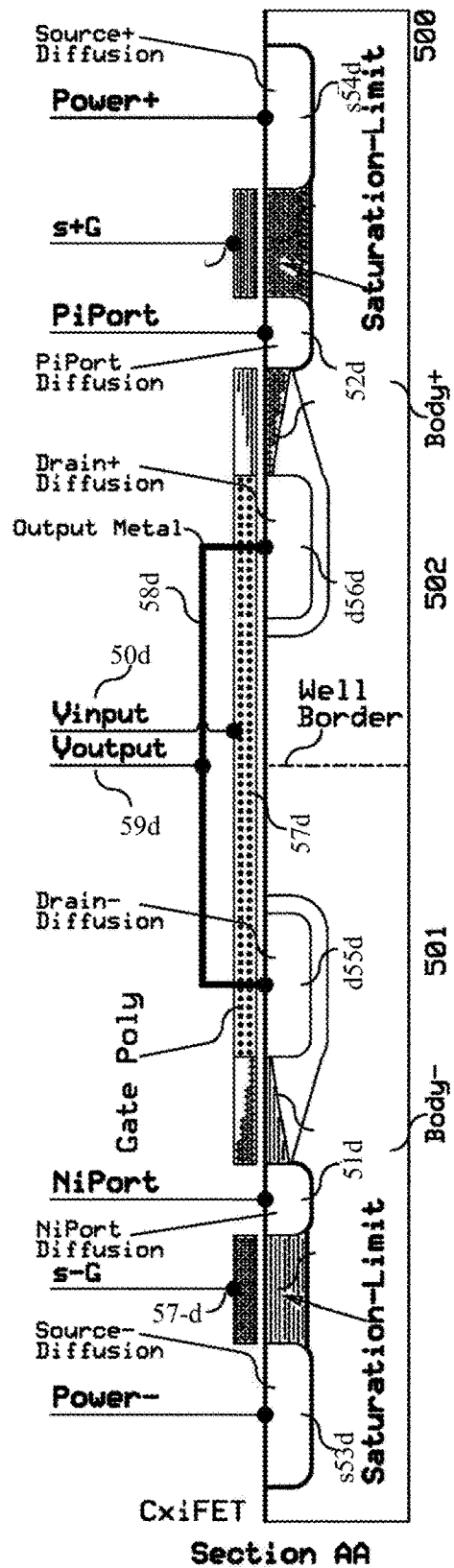

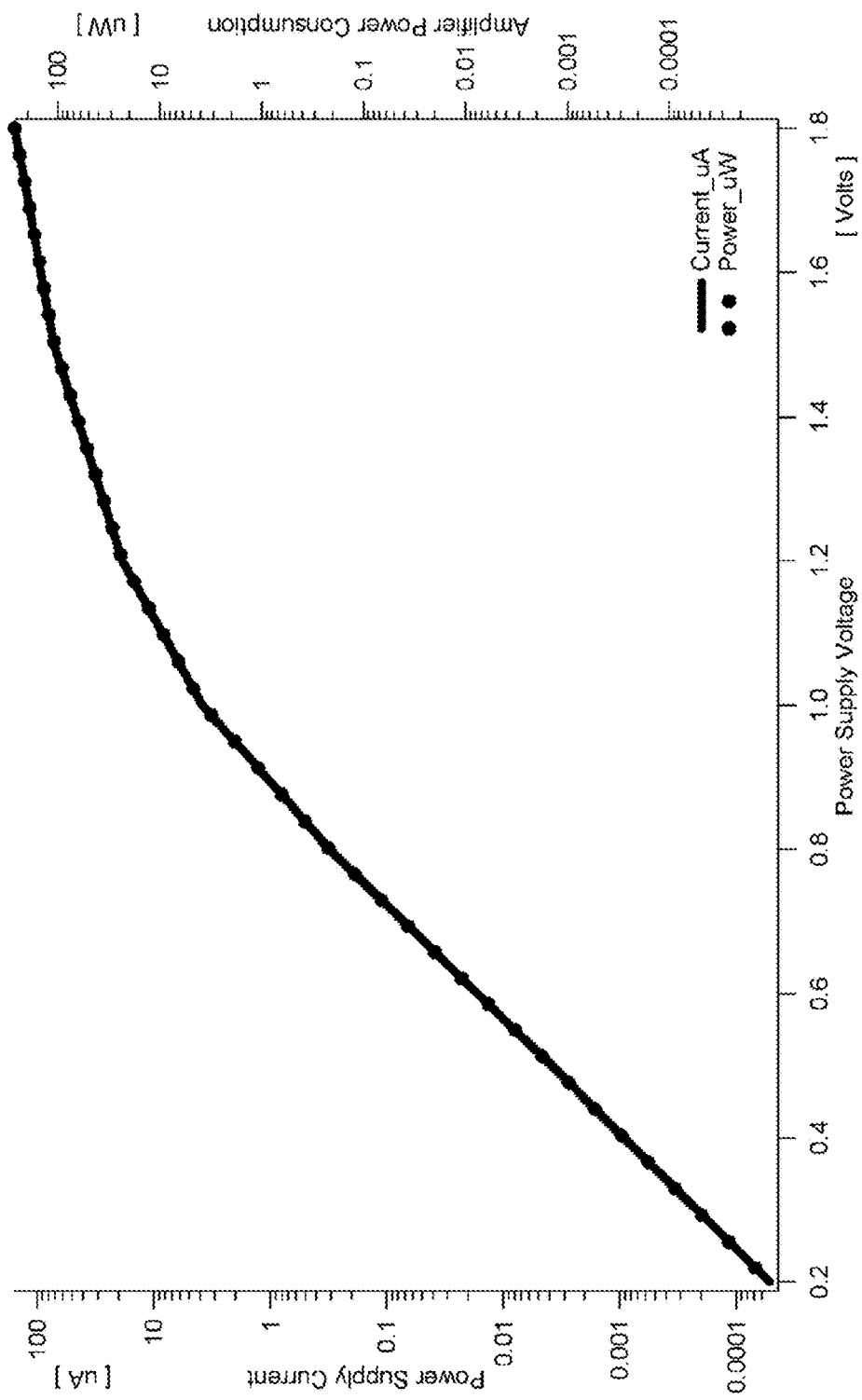
Figure 7c

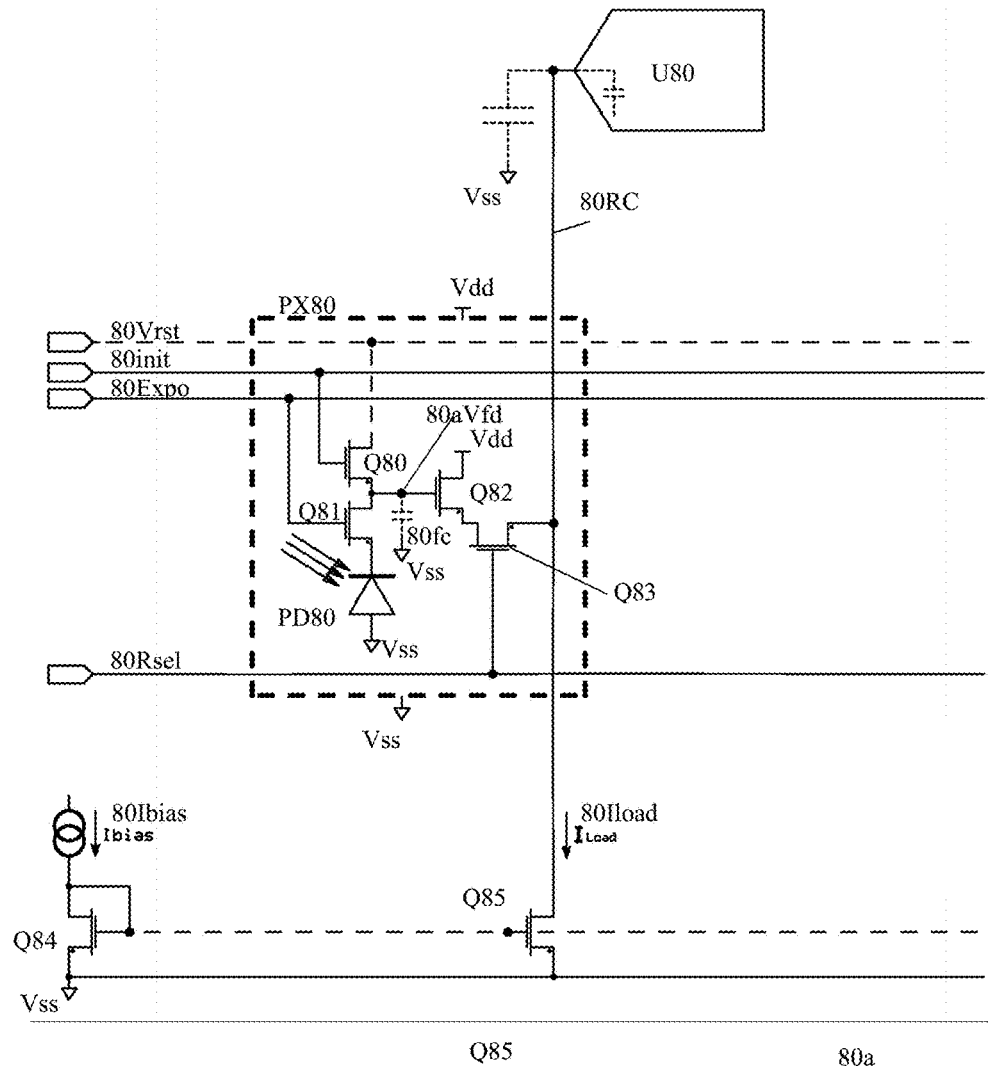
PRIOR ART
Figure 8a(1)

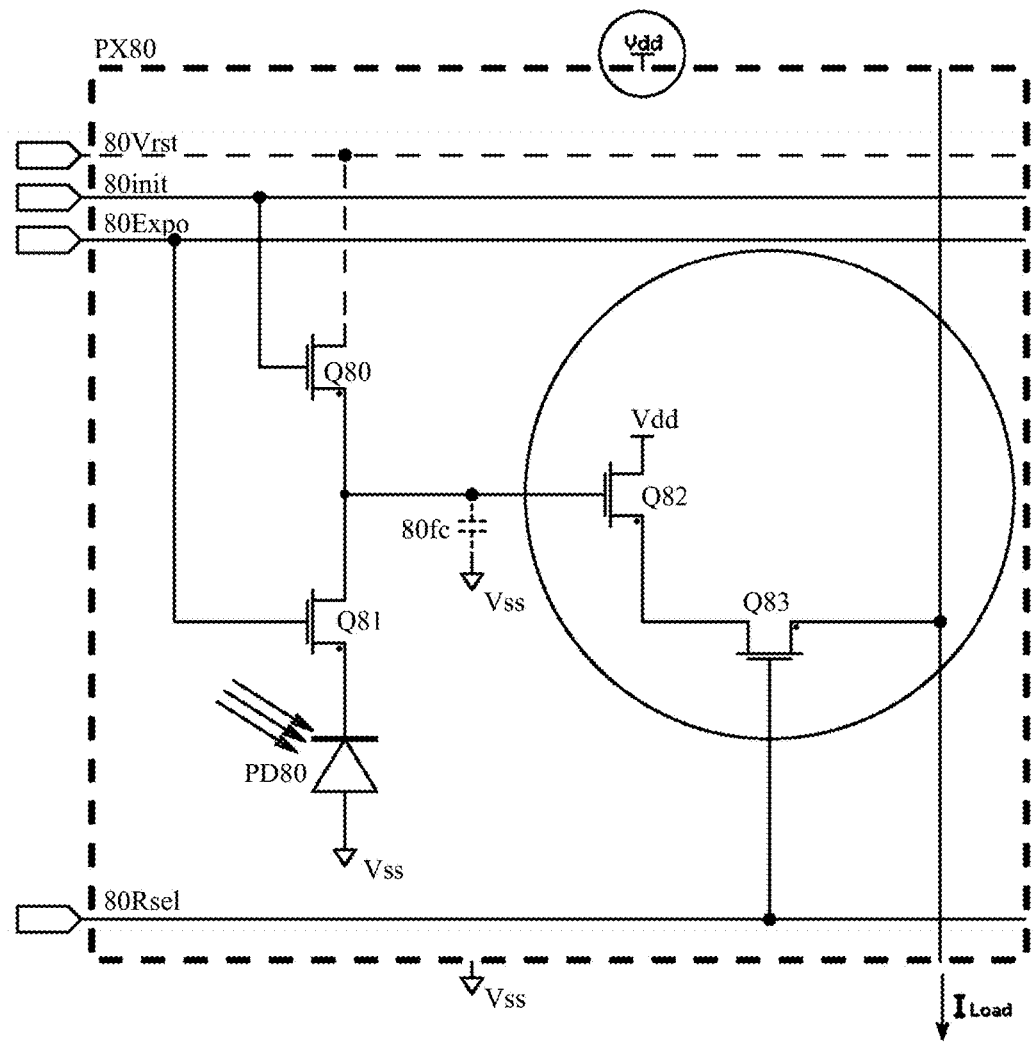
PRIOR ART
Figure 8a(2)

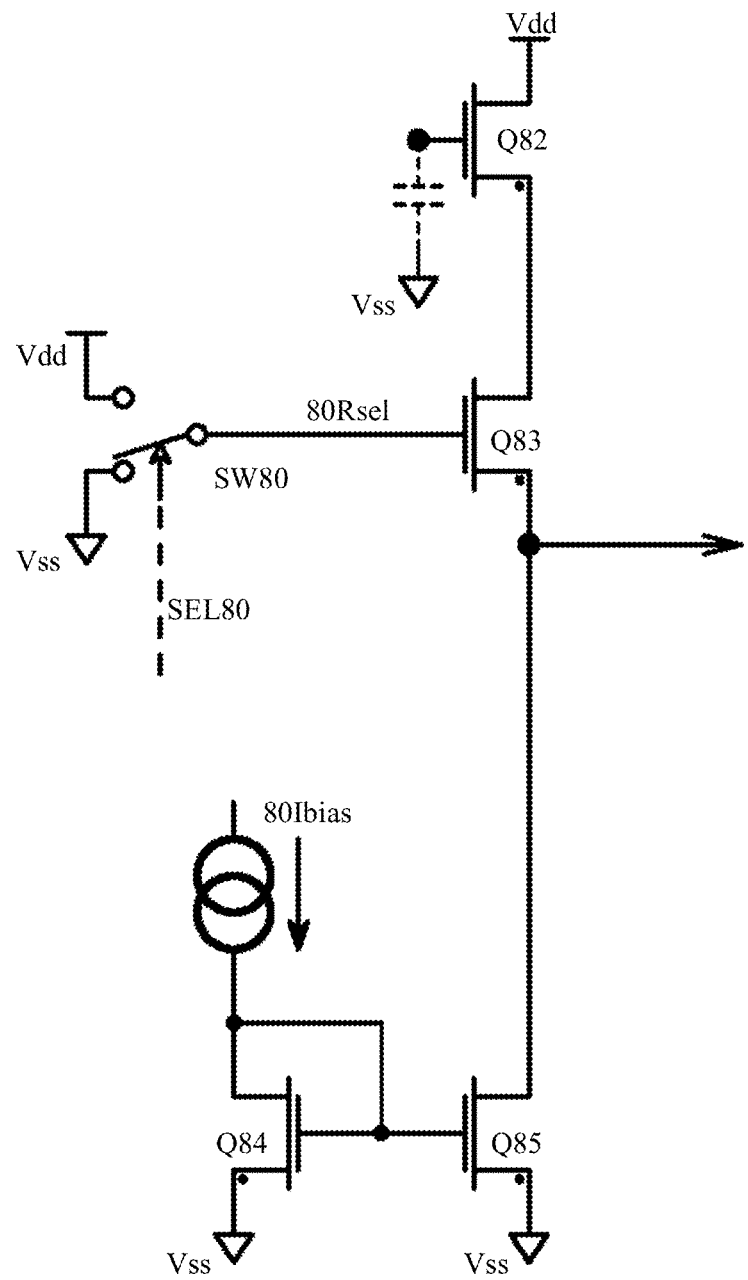
PRIOR ART
Figure 8b

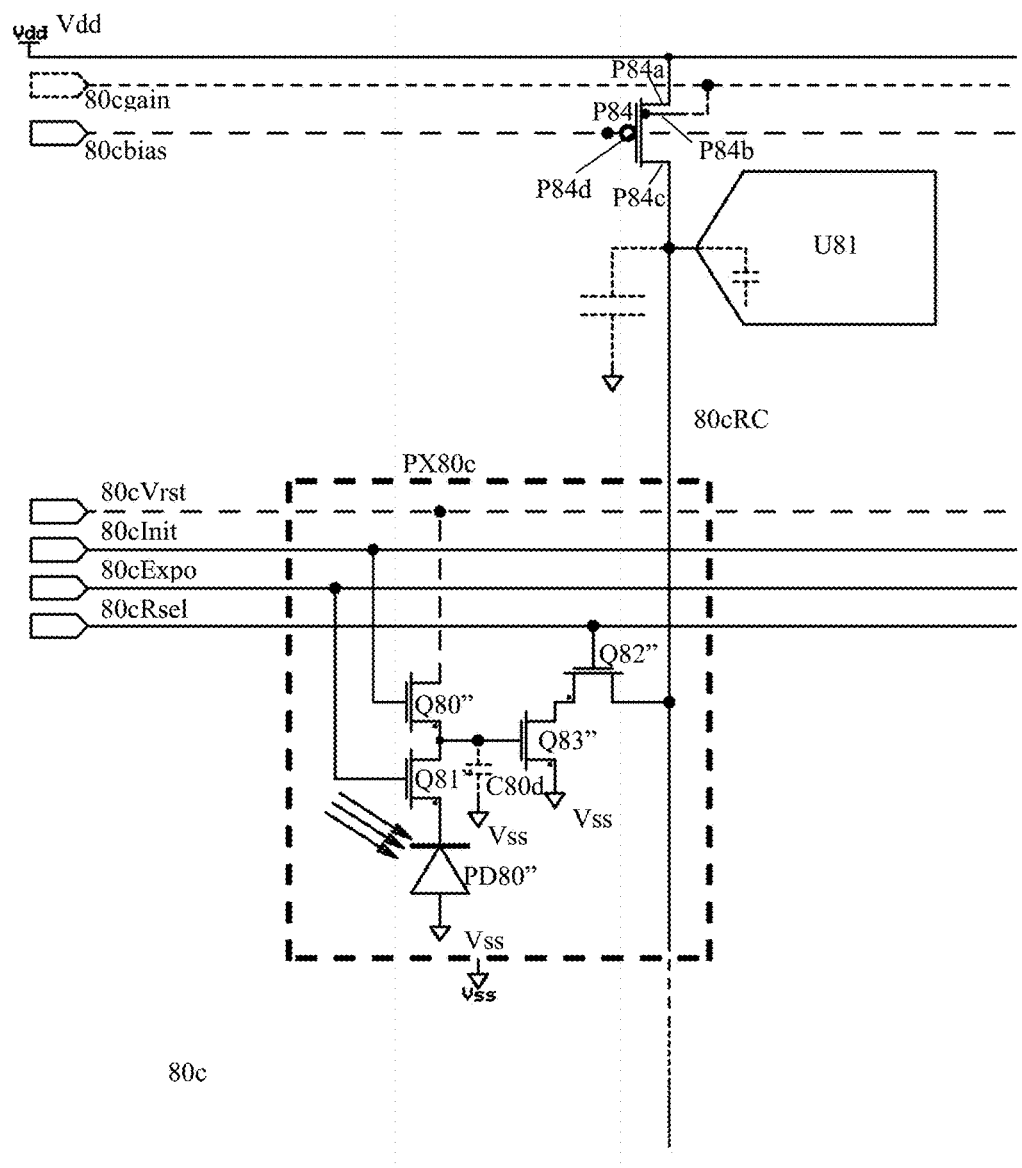
Figure 8c(1)

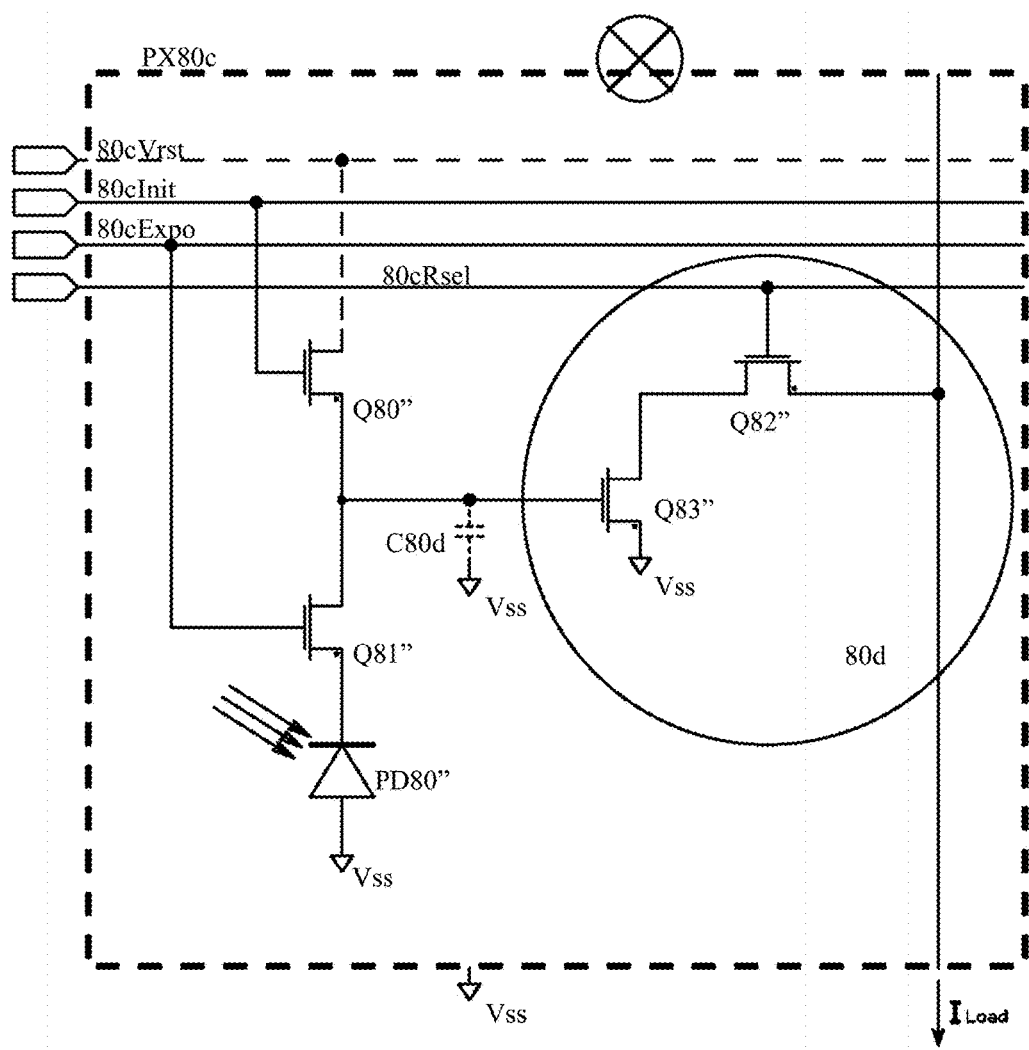
Figure 8c(2)

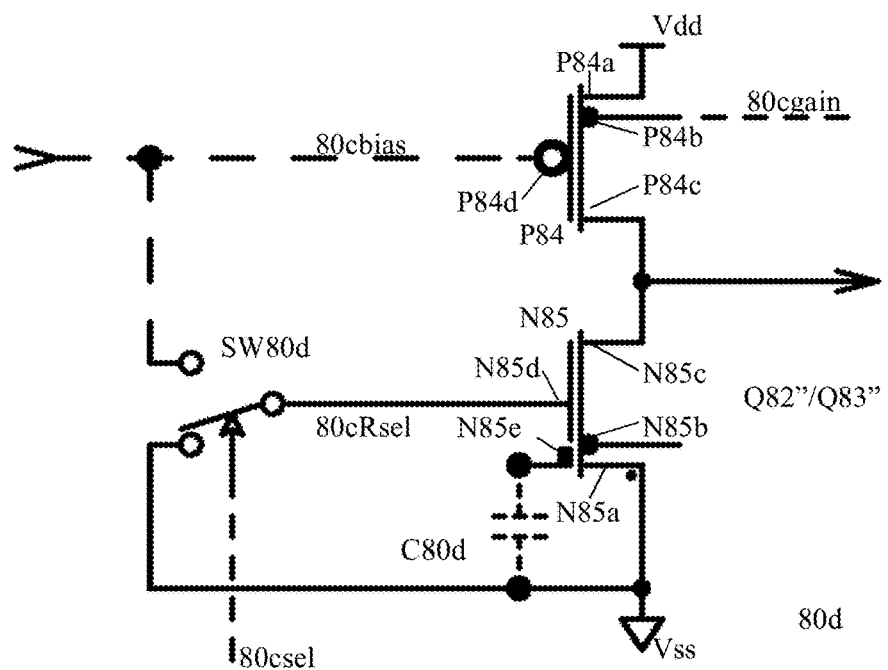
Figure 8d
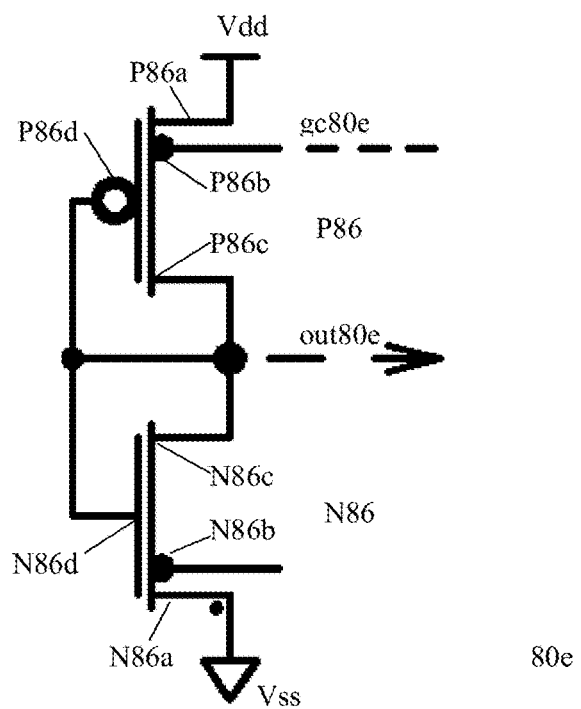
Figure 8e

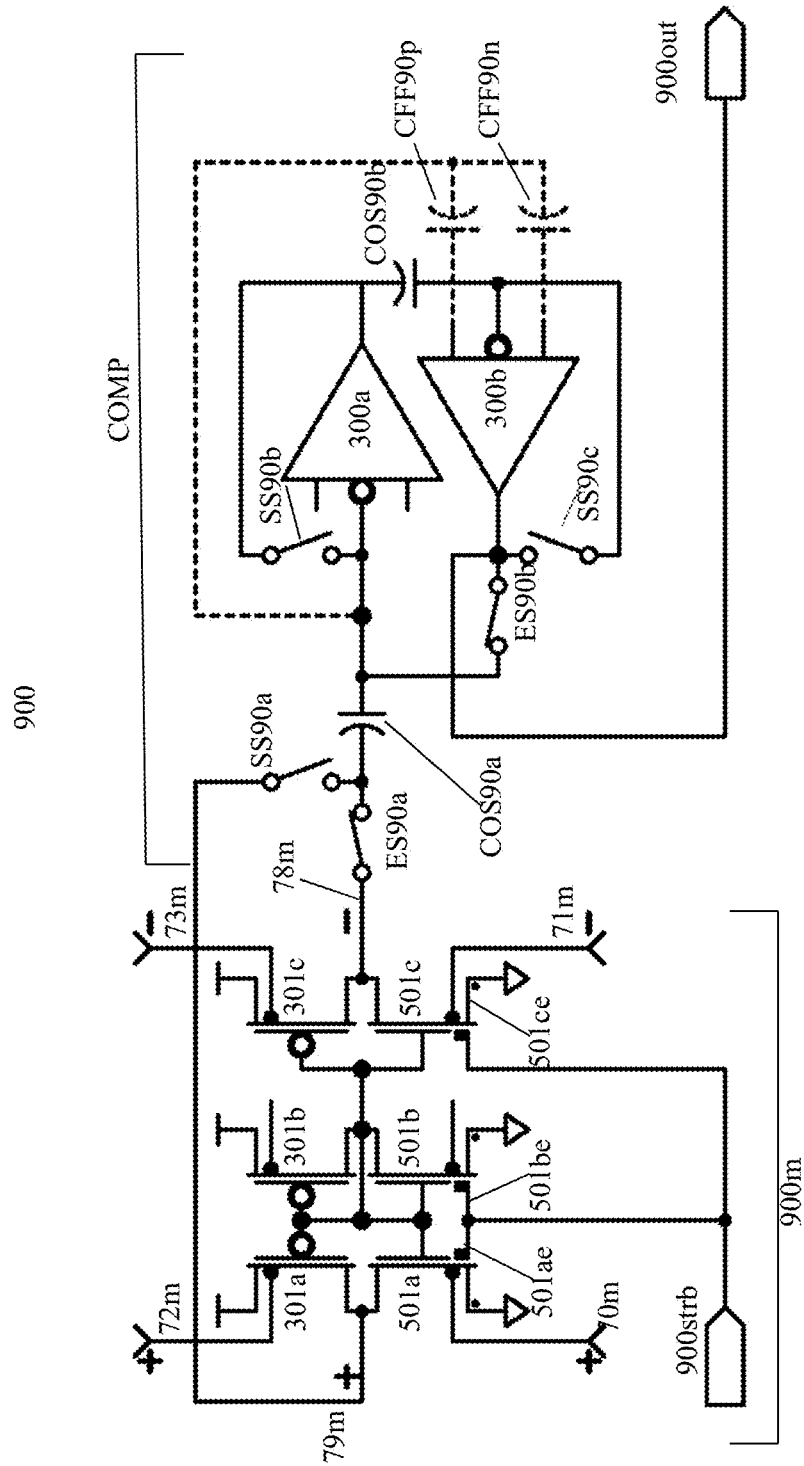
Figure 9a

SUPER-SATURATION CURRENT FIELD EFFECT TRANSISTOR AND TRANS-IMPEDANCE MOS DEVICE

CROSS-REFERENCE TO RELATED APPLICATIONS

The present application is a continuation of the non-provisional application Ser. No. 15/748,908, filed on Jan. 30, 2018, which is 35 U.S.C. § 371 National Phase Entry of, and claims priority to PCT International Application No. PCT/US2016/044800 filed on Jul. 29, 2016, which claims the benefit of and priority to U.S. Provisional Application No. 62/267,174 filed on Dec. 14, 2015, the contents of which are incorporated herein by reference.

BACKGROUND OF THE INVENTION

Field of the Invention

The present invention relates to an improvement to a current field effect transistor and trans-impedance MOS devices based on a novel and inventive compound device structure, enabling a charge-based approach that takes advantage of sub-threshold operation, for designing analog CMOS circuits. The present invention further relates to super-saturation current field effect transistors.

Description of Related Art

The new millennium brings with it a demand for connectivity that is expanding at an extremely rapid pace. By the end of year 2015, the number of global network connections will exceed two times the world population and it is estimated that in 2020 more than 30 billion devices will be wirelessly connected to the cloud forming the Internet of Things (or "IoT"). Enabling this new era are the revolutionary developments in mobile computing and wireless communication that have arisen over the last two decades. Following Moore's Law, development of highly-integrated and cost-effective silicon complementary metal oxide semiconductor (CMOS) devices allowed incorporation of digital and analog system elements, such as bulky Analog-to-Digital converters or transceivers, into a more cost effective single chip solution.

In the last few years, however, while digital circuits have largely followed the predicted path and benefited from the scaling of CMOS technology into ultra-deep submicron (sub-µm), analog circuits have not been enabled to follow the same trend, and may never be enabled without a paradigm shift in analog design. Analog and radio frequency (or "RF") designers still struggle to discover how to make high-performance integrated circuits (or "ICs") for ultra-deep sub-µm feature sizes without losing the benefits of shrinking size; including reduced power, compact footprint, and higher operational frequencies. Truly a paradigm shift is needed to break through the established science of analog design to meet the system on chip (SoC) demands of the new millennium.

PRIOR ART

The core building block of analog circuits is the amplifier. Discrete component amplifiers are free to use resistors, capacitors, inductors, transformers, and non-linear elements as well as various types of transistors. Unwanted parasitics between various components are normally negligible. However, in order to build amplifiers within an integrated circuit, the normal analog circuit components are not readily available, and often take special IC process extensions to obtain these circuit elements if at all. The parasitics on integrated circuit amplifiers are severe due to their close proximity and being coupled together through the silicon wafer they are integrated into. Moore's law IC process advancements are focused on digital, microprocessor, and memory process development. It takes a generation (~18 months) or two to extend the IC process to incorporate analog components, thus analog functionality is generally not included on the latest process single chip systems. These "mixed-mode" IC processes are less available, vender dependent, and more expensive as well as being highly subject to parametric variation. It takes substantial engineering to include sparse analog functionality on any IC which becomes specific to its IC vender and process node. Because analog circuitry is carefully and specifically designed or arranged for each process node, such analog circuitry is highly non-portable. Reprobating this limitation, analog circuit design engineers are becoming scarce and are slowly retiring without adequate replacements.

Operational Amplifiers (or OpAmps) are the fundamental IC analog gain block necessary to process analog information. OpAmps make use of a very highly matched pair of transistors to form a differential pair of transistors at the voltage inputs. Matching is a parameter that is readily available on an integrated circuit, but to approach the required level of matching, many considerations are used: like centroid layout, multiple large devices, well isolation, and physical layout techniques among many other considerations. Large area matched sets of transistors are also used for current mirrors and load devices. OpAmps require current sources for biasing. OpAmps further require resistor and capacitor (or RC) compensation poles to prevent oscillation. Resistors are essential for the "R" and the value of the RC time constant is relatively precise. Too big value for a resistor would make the amplifier too slow and too small results in oscillation. Constant "bias" currents add to the power consumed. In general, these bias currents want to be larger than the peak currents required during full signal operation.

As IC processes are shrunk, the threshold voltages remain somewhat constant. This is because the metal-oxide-semiconductor (or MOS) threshold cutoff curve does not substantially change with shrinking of the IC processes and the total chip OFF leakage current must be kept small enough to not impact the full-chip power supply leakage. The threshold and saturation voltage tends to take up the entire power supply voltage, not leaving sufficient room for analog voltage swings. To accommodate this lack of signal swing voltage, OpAmps were given multiple sets of current mirrors, further complicating their design, while consuming more power and using additional physical layout area. This patent introduces amplifier designs that operate even better as power supply voltages are shrunk far below 1 volt.

The conventional MOS amplifier gain formation is an input voltage driving a trans-conductance ($g_m$) which converts the input voltage into an output current. This output current then drives an output load which is normally the output of a current source for the purpose of establishing a high load resistance. This high resistance load converts the output current back into an output voltage. The equivalent output load resistance is actually the parallel combination of the load current source transistor and the amplifier output transistors. In order to keep this equivalent load resistance high to provide the required voltage gain, these load transistors must be very long, but to drive enough current these transistors must be very wide also, thus very large transistors are necessary. It also might be noted that the load resistance the amplifier output drives is additional parallel resistance that reduces the voltage gain. It should also be noted that a load capacitance interacts with the amplifiers output resistance, modifying the AC performance. What is actually needed is exactly the inverse operating principle, which the present invention is about. FIG. 1a is a transistor level schematic diagram of a high-quality MOS IC OpAmp as a baseline reference (from the Wiley textbook: Analysis and Design of Analog Integrated Circuits by Gray and others, $4^{th}$ edition pg. 482) which is used for comparison in the description of the amplifiers illustrated herein.

The baseline comparisons are (all made in an 180 nm IC process) in the form of performance plots as in: a Bode Gain-Phase plot over frequency FIG. 1b, when $V_{dd}$=1.8 Volts and $R_{cmp}$=700 ohms. Wherever possible all the axis scales for each of these three comparison plots are kept the same. A readily available 180 nm process was selected for comparison of all the comparative examples in this document because the conventional prior art amplifiers work best and have had the most usage and have mature mixed-mode IC process extensions offered which are required for conventional analog. Also as the IC process is shrunk and the power supply voltage is decreased, this is where the implementations of the present invention become highly beneficial.

Normally MOS amplifiers operate within a square-law relationship due to the strong inversion MOS transistor square-law characteristics; these are not very well defined or predictably stable to the degree that analog circuits need. Exponential-law operation, like bipolar transistors operation is higher gain, stable, and well defined. At very weak operating conditions, MOS transistors convert to exponential operation, but they are too slow to be of very much use. Furthermore, the "moderate-inversion" transition between these two operating mode provide non-linarites that lower the quality of analog MOS circuits. At the threshold voltage, where MOS transistors operate around, is where 50% of the current is square-law and the other 50% is exponential. This is the definition of threshold voltage in the latest MOS simulation equations. Full exponential MOS operation at high speed would provide higher gain that is predictable, stable, and well defined. This patent is about amplifiers that operate in the exponential mode.

To understand the prior art, let's begin with a discussion of Weak vs. Strong inversion. Referring to FIGS. 1e and 1f, weak inversion is the range where most designers would consider the transistor to be OFF:

Drain to Source voltage is small (on the order of 100 mV);
The gate G (or 17s) is at a similar small potential (typically less than 300 mV);
This creates a surface conduction layer, of uniform depth from source S to drain D;
The conductivity of this surface layer is exponential with respect to the Gate G voltage;
This allows operation over many decades (about 6) of dynamic range;
The channel appears as a moderate value resistor ($100^+$s of K-Ohms); and
The uniform depth conduction channel promotes an exponentially higher gain but with a speed penalty (due to low charge density in the conduction channel).

Strong inversion (referring to FIGS. 1g & 1h) is characterized by a graduated conduction channel, deeper near the Source and shallow near at the Drain:

Drain to Source voltage is larger than the Gate to Source voltage Vg of FIG. 1g and threshold $V_{threshold}$ in FIG. 1h (typically in excess of 400 mV);
The Gate 17u is operated above its threshold voltage $V_{threshold}$;
This creates a conduction channel that is deeper at the Source and tapers to near pinch-off at the Drain 12u;
The resulting conduction layer behaves with a Square-law response to the gate voltage at the Gate 17u;
Dynamic range is limited to about 3 decades as compared to weak inversion;
The channel 12g appears as an adjustable current source (high value resistor); and
The wedge shape of the conduction channel 12g provides higher speed than weak inversion because of higher charge density in the conduction channel.

Now, referring back to FIG. 1e, which shows the channel 12e development under weak inversion conditions. The conduction channel 12e has a relatively even distribution of carriers over its entire length and width. Note that the conduction depth 10s of the entire channel is the same as the pinch-off area 12u on the right side of FIG. 1g. This thin conduction layer contributes a significant amount of noise because the channel current travels along the surface where charge carrier defect traps are concentrated. The Gate 17s to channel voltage $V_g$ in FIG. 1e has a strong (exponential) effect on the density of carriers in this conduction layer.

FIG. 1g shows the channel 12u development under Strong inversion conditions. The higher potential difference between Source and Drain over the gate 17u causes "channel length modulation" (the flat part of the channel 12u), resulting in pinch-off near the drain diffusion where the channel reaches a thin layer near 12u. The pinch-off region 12u (where the carriers are forced to the top of the channel) imparts significant noise by means of surface defect carrier traps. The higher the drain voltage $V_d$, the longer the pinch-off region and thus the higher the contributed noise, thus it is desired to keep this voltage low for low noise contribution to the channel current. Other effects such as velocity saturation and hot electron jumping over into the gate oxide are noted around this thin saturated pinch-off region, thus it would be highly desirable to minimize this region by lower voltage and semiconductor doping profiles.

FIG. 1h shows a characteristic plot which approaches a "constant current" relationship between drain current Id and drain voltage $V_{ds}$ with a fixed Gate voltage $V_g$ on the gate G. It is to be noted that the drain voltage $V_{ds}$ spans a large range of nearly the power supply voltage $V_{dd}$, while maintaining the same current as opposed to the limited drain voltage range of FIG. 1f.

FIG. 1i to 1k illustrate a prior art MOS structure, commonly known as a CMOS inverter, that turns out to actually combine both modes of operation. A pair of MOSFETs with opposite conductivities, PFET and NFET, are complementary connected with each other. For example, the input 10i, 10j, 10k is connected to both the gate control terminal of PFET and the gate control terminal of NFET, the source of PFET is connected to power supply (+), while the source terminal of NFET is connected to power supply (−); and the drain of PFET and the drain of NFET connected together for $V_{out}$ 19i.

FIG. 1j shows the structure related to a physical layout abstraction shown in FIG. 1k, which is 2× strength CMOS or two-finger inverter of prior art. As stated above, gate terminals of PFET and NFET are connected together to receive $V_{input}$ 10j and 10k and the drain terminals of PFET and NFET are connected together for producing $V_{output}$ 19j and 19*k*. The layout shown in FIG. 1*k* structurally corresponds to that of FIG. 1*i*. As it can be seen, to minimize various shortcoming from the conventional FET layouts, such as minimizing parasitic output capacitance, the source terminal of PFET, for example, is split into two source terminals S+ and S+, and the drain terminal D+ 12*k* is displaced therebetween for forming a pair of parallel channels 14*k* and 16*k* between S+ and D+ 12*k*; p-channel region of the gate G covers the parallel channels 14*k* and 16*k*. Divided by the well border WB, NFET is also provided with a pair of source terminals, S− and S−, and the drain terminal thereof, D− 11*k* is displaced therebetween for forming a pair of parallel channels 13*k* and 15*k* between S− and D−; n-channel region of the gate G further covers the parallel channels 13*k* and 15*k*. Drains 12*k* and 11*k* are connected therebetween through metal work 18*k* and forms $V_{output}$ 19*k*.

A 3-dimensional prospective view of this MOS transistor structure is shown in FIG. 1*m*, while cross sectional view at section AA in FIG. 1*m* is shown in FIG. 1*n*. This structure is inherent in a 2× or two-finger inverter as shown in FIGS. 1*j* and 1*k*. As it can be seen therein at the parallel channels 14*k* and 16*k* in PFET and the parallel channels 13*k* and 15*k*, all of these channels taper from the drains D+, D− to the sources S+, S−.

Although similar MOS structures appear in prior art, no significant exploitation of many of its unique properties are known or published. In addition, proper biasing remains as a problem(s) for its operation(s). A deeper understanding of the internal mechanisms resulted in discovery of many desirable applications (enabling superior operation at deep-sub-micron scale), including an approach to proper biasing that takes advantage of natural equilibrium. This natural equilibrium is the result of a "Band-Gap" voltage reference mechanism, again functional at deep-sub-micron scale.

Referring to FIGS. 1*p* and 1*q*, some references show a MOS field effect transistor device with two identical regions 13*p*/13*q* and 15*p*/15*q* of like "conductivity type" separated by a diffusion region 11*p* (designated as Z for Low Impedance in the prior art). Multiple papers by Bedabrata Pain/R Schober, Jet Propulsion Lab and Jacob Baker/Vishal Saxena, Boise State University, including Pain, Bedabrata et al., "A Self-Cascoding CMOS Circuit for Low-Power Applications", Center for Space Microelectronics Technology Jet Propulsion Laboratory, California Institute of Technology, contain such references, but these references do not exploit any opportunities as shown in this document, especially when complementary devices like this are combined into a single composite device as will be explained in this invention. Such configurations have been called self-cascading or split-length devices. The two regions of such a configuration are arranged between source and a drain diffusions and have both a high impedance common gate connection and a low impedance connection to the mid channel regions. This low impedance mid channel control input, when exploited as outlined in this document, enables an entirely new set of analog design methods.

Although a cascade amplifier can be found in prior art, the prior art does not contain a complementary pair of cascade transistors connected as a totem-pole. With this simple compound structure, feedback from the output to the input can be used to self-bias the resulting inverter into its linear mode. As mentioned above, biasing of an amplifier has always been problematic; however, the novel and inventive self-biasing structure of the present invention addresses such an issue. Advantages of the configuration of the present invention (referred to as a complementary iFET or CiFET) are many, including, but not limited to:

Gain of the single stage is maximum when the output is at the midpoint (self-bias point);

The gain of a single CiFET stage is high (approaching 100), therefore, while the final output may swing close to the rails, its input remains near the midpoint. The stage before that, because of the high gain, operates its input and output near the mid-point ("sweet-spot") where the gain is maximized. So too for each of the preceding stages;

Slew rate and symmetry are maximized where the channel current is highest (near the mid-point);

Noise is minimized where the channel current is highest (near the mid-point); and Parasitic effects are negligible where the voltage swing is small.

When the gate input signal moves in one direction, the output moves in the inverse direction. For example; a positive input yields a negative output, not so much because the N-channel device is turned on harder, but rather because the P-channel device is being turned off. Thevenin/Norton analysis shows that the current through the P and N devices must be exactly the same, because there is nowhere else for drain current in one transistor to go except through the drain of the complementary transistor; however, the voltage drop across these devices does not have to be equal, but must sum to the power supply voltage. Due to the super-saturated source channel, these voltages are tied together exponentially. This is even more evident at low power supply voltages where the voltage gain peaks. This means that the gate-to-source voltage is precisely defined by the same and only drain current going through both transistors. Exponentials have the unique physical property like a time constant, or "half-life;" It does not matter where we are at a given point of time, a time constant later we will be a fixed percentage closer to the final value. This is a "minds-eye" illustration of the primary contributor to output movement in response to input change. This same current balance of gate-to-source operating voltages also indicates why the "sweet-spot" in the self-biased amplifier is so repeatable. In effect it is used as a differential pair-like reference point to the amplifier input signal.

It is to be noted that during the transition from vacuum tubes to bipolar transistors the industry underwent a major paradigm shift, learning to think in terms of current rather than voltage. With the advent of FETs & MOSFETs the pendulum swing is back toward thinking in terms of voltage, but much knowledge has been lost or forgotten. Herein is contained the rediscovery of some old ideas as well as some new ones, all applied to the up-coming "current" state of the art. It is believed that the inherent simplicity of the present invention speaks to their applicability and completeness.

A first issue may be that there is always a need for a little analog functionality, yet nearly all analog performance metrics of a MOS transistor are remarkably poor as compared to that of a Bipolar transistor. The industry has made MOS devices serve by employing extensive "work-arounds." Conventional analog design is constrained by one or more of the followings:

Power supply voltages sufficient to bias the stacked thresholds, and transistors large enough to supply the necessary output drive current while still providing the high output impedance required for linearity and gain ($g_m*R_L$).

Lack of analog IC process extensions (unavailable at nanometer scale) are required for linear signals, let alone with the enhanced performance demonstrated herein.

Resistors, inductors, and large capacitors are mostly nonexistent for analog designs in newer IC processes.

In contrast, bipolar transistors can be made to have high gain (β), wider bandwidth, wider dynamic range (many decades, from near the rails down to the noise floor), better matching (found in differential pairs), and band-gap references. Junction FETs, which operate with sub-surface channel conduction below the surface defects, have lower noise than bipolar transistors. Likewise the CiFET super-saturated source channel operates primarily below the defects at the channel surface underneath the gate oxide.

MOS designs are poorer in the above areas but have their own extreme advantages, including, but not limited to:
  MOS devices are small and relatively simple
  highly scalable
  high speed
  low power
  ultra-dense/high functionality systems on a chip, where Bipolar designs cannot go (deep sub-μm scale).

Accordingly, building analog circuits on an IC has always been problematic. Engineering around poorly performing analog components has been the overriding objective for analog IC designers since analog circuits have been integrated. This drove the need for digital signal processing with algorithm development yielding digital magic.

Today the real-world of analog circuit design, signals still need to be converted on both the front and back end of signal processing systems. This need has become a road-block at deep sub-μm scale.

Another problem may be that solid-state amplifiers have been notoriously non-linear since their inception. To make them linear, increased open loop gain (with levels significantly higher than is ultimately needed) is traded for control over actual circuit gain and linearity through the use of a closed loop (feedback). A closed loop amplifier requires negative feedback. Most amplifier stages are inverting, providing the necessary negative feedback. A single stage inverter, with a closed loop, is stable (does not oscillate). Increased loop gain requires stages be added such that there are always an odd number of stages (sign is negative), to provide the necessary negative feedback. While a single stage amplifier is inherently stable, three stages and most definitely five stages are unstable (they always oscillate—because they are ring oscillators).

The problem then is how to properly compensate a multi-stage closed loop amplifier while maintaining a reasonable gain-bandwidth product. This is particularly difficult at deep-sub-micron scale where circuit stages must be simple in their design. The severely limited power supply voltages preclude the use of conventional analog design approaches. Additionally, it is desirable to avoid reliance upon analog extensions but rather to accomplish the necessary analog functions using all digital parts, to improve yields and decrease costs. Using all digital parts allows analog functions at process nodes that do not yet have analog extensions, and may never have them.

There is a long felt need for low-cost/high-performance systems integrated on a single chip for affordable high-volume devices such as the Internet of things, smart-sensors, and other ubiquitous devices.

SUMMARY OF THE INVENTION

The present invention relates to circuits built out of a novel and inventive compound device structure, which enables a charge-based approach that takes advantage of exponential relationships of a super-saturated source channel below which possesses sub-threshold-like operation when used for analog CMOS circuit designs. The present invention is an evolution of an ordinary CMOS inverter, and further improvement of a current field effect transistor (iFET). It provides extremely high precision, speed, linearity, low noise, and a compact physical layout, using an all-digital nanoscale or deep sub-μm IC process. In addition to the expected digital inverter function, five classes of analog circuits are exemplified: a voltage input amplifier, a current input amplifier, a current inverter as opposed to a current mirror, an adjustable delay circuit, and a voltage or current reference source. Take special note that analog functionality is realized, in a digital IC process, using a single optimized digital logic circuit cell.

According to another aspect of the present invention, it provides a super-saturation iFET (or xiFET) device having a source terminal, a drain terminal and a diffusion (or iPort) terminal, defining a source channel between the source terminal and diffusion terminal, and a drain channel between the drain terminal and the diffusion terminal. Instead of a common gate that capacitively coupled to the source and drain channels, the device has a first gate that is capacitively coupled to the source channel and a second gate that is capacitively coupled to the drain channel.

According to another aspect of the present invention, it takes advantage of the Doping Profile and Ratioing. Not everything in optimizing a circuit has to do with the circuits' electrical configuration. Proper device sizing and especially adjusting the size relationship between complementary transistors provides considerable performance benefits. The xiFET, being a compound structure, offers extensive opportunity to establish impedance matching and gain control through proper ratio of the physical device parameters. Other important characteristics, like noise, speed, and power, can be tailored through careful specification of the physical construction and doping of the transistors, rather than relying solely on circuit configuration.

According to yet another aspect of the present invention, it provides certain noise advantages. In the end, it comes down to signal-to-noise ratio. Low power supply voltage requirements in ultra-deep-sub-micron IC processes limit the maximum signal swing to a much smaller number than most analog designers are used to. So with a smaller signal, the low-noise techniques embodied herein must be employed in order to maintain the desired signal to noise ratio.

Additional Advantages may be provided by the present invention. The primary advantage delivered by this technology is the ability to produce analog building blocks constructed entirely from digital parts, without analog extensions. Equally important is the fact that it actually operates at ultra-deep-sub-micron scale, and operates best at reduced power supply voltages below one volt as required for ultra-deep sub-μm IC processes. These three factors contribute to an unprecedented portability of designs across process nodes. Entirely new circuit designs will be realized because of a FET that has more than one control input. The CiFET offers a high-impedance voltage control on the gate while simultaneously offering a low-impedance current control at the iPorts. These two inputs operate independently of each other and their independent response is summed at the output.

According to yet another aspect of the present invention, it provides a complementary xiFET compound device, which can be configured as a current input amplifier or complementary current low noise amplifier (CxiLNA). For example, the CxiFET compound device, used as a current amplifier, offers an unexpectedly wider dynamic range with great linearity over an extreme frequency range. This CxiLNA provides constant gain and input resistance in its passband. The CxiLNA of the present invention does not suffer from phase shift in the passband. This CxiLNA operates with power supplies down to the millivolt level with a reasonable bandwidth. The CxiLNA is not dependent on operation above the normal MOS threshold voltages. A skilled reader in the art would appreciate and find it useful in many applications as a gain block that is unencumbered by the surrounding parasitics, due to the fact that CxiLNA of the present invention exhibits an incredibly higher signal to noise ratio. Such a performance is seldom seen, even in LNAs.

BRIEF DESCRIPTION OF FIGURES

FIG. 1a illustrates a high quality CMOS OpAmp prior art transistor schematic from a prominent textbook "Analysis and Design of Analog Integrated Circuits," 4$^{th}$ Ed, by Gray, Hurst Lewis and Meyer, p482 as a prior art amplifier for comparison;

FIGS. 1b to 1d are a baseline set of representative performance plots illustrating frequency domain performance and power supply dependency of the prior art OpAmp of FIG. 1a;

FIGS. 1e and 1g show cross-sectional views of prior art MOSFET channel conduction in weak inversion and in strong inversion, respectively, and FIGS. 1f and 1h show plots bearing exponential relationship between drain current and gate voltage when in weak inversion and quadratic relationship when in strong inversion, respectively;

FIG. 1i shows a transistor schematic of two (2) finger inverters of prior art;

FIGS. 1j and 1k show physical layout abstractions of the two (2) finger inverters of prior art;

FIG. 1m shows a three (3) dimensional perspective view of the two (2) finger inverters of prior art;

FIG. 1n shows cross-sectional view at Section AA shown in FIG. 1m;

FIG. 1p shows a physical layout of a split channel CMOS transistor of prior art;

FIG. 1q shows a 3D perspective view of an analog-sized MOSFET of prior art;

FIG. 1r shows a physical layout plan of an analog-sized array of Fin field effect transistors (FinFET) of prior art;

FIG. 1s shows a zoomed perspective view of inside the circle Z shown in FIG. 1r, showing a perspective view of a FinFET of prior art;

FIG. 1t shows a plot representing intrinsic gain scaling of nMOS transistor of prior art;

FIG. 2a illustrates a three (3) dimensional prospective view of a MOS field-effect transistor (or iFET) with a new mid-channel bi-directional current port (iPort) of the present invention;

FIG. 2b illustrates a cross-sectional view of iFET of the present invention with visualized channel charge distributions;

FIG. 2c shows a graph of drain voltage $V_{ds}$ and drain current Is when there is no iPort injection current, while FIG. 2d shows another graph when max iPort injection current is provided;

FIG. 2e shows various iFET symbols of the present invention;

FIG. 3a illustrates a schematic diagram of complimentary pair of iFETs of the present invention;

FIGS. 3b and 3c illustrate a physical layout abstraction of a complementary iFET (or CiFET) compound device of the present invention;

FIG. 3d shows a three (3) dimensional perspective view of the CiFET compound device;

FIG. 3e illustrates cross-sectional view at Section AA of FIG. 3d;

FIGS. 3f, 3g and 3h illustrate a CiFET operational modeling, self-bias schematic and symbol therefor;

FIG. 4a illustrates a three (3) dimensional perspective view of a super-saturation current field effect transistor (xiFET) of the present invention;

FIG. 4b illustrates a symbol representation of the xiFET shown in FIG. 4a;

FIG. 4c illustrates a cross-section view of the xiFET shown in FIG. 4a;

FIG. 5 illustrates a schematic diagram of a complementary pair of xiFET (or CxiFET) of the present invention;

FIG. 6 illustrates a physical layout abstraction of the CxiFET shown in FIG. 5;

FIG. 7a illustrates a three (3) dimensional perspective view of the CxiFET shown in FIG. 5;

FIG. 7b illustrates a cross-section view of the CxiFET shown in FIG. 7a at Section AA;

FIG. 7c illustrates a power diagram for CxiFET in accordance with the present invention;

FIG. 8a(1) shows a schematic diagram of a focal plane array readout column of prior art;

FIG. 8a(2) shows a schematic diagram of one array pixel portion of the focal plane array shown in FIG. 8a(1);

FIG. 8b shows a schematic diagram of a portion of readout column of the focal plane array shown in FIG. 8a(1);

FIG. 8c(1) shows a schematic diagram of a focal plane array readout column using CiFET in accordance with the present invention;

FIG. 8c(2) shows a schematic diagram of a one array pixel portion of the focal plane array shown in FIG. 8c(1);

FIG. 8d shows a schematic diagram of a portion of readout column of the focal plane array shown in FIG. 8c(1);

FIG. 8e shows a schematic diagram of gain controllable bias generator in accordance with the present invention; and FIG. 9a shows a schematic diagram of latch current comparator in accordance with the present invention.

DETAILED DESCRIPTION OF THE INVENTION

A MOS structure referred to herein as an iFET, where the letter "i" refers to a current and "FET" refers to a Field Effect Transistor, is the enabling element of several high performance and novel designs of the present invention. The present invention is based on the addition of a direct connection to a mid-point in a Field Effect Transistor (or FET) channel and the realization that this is a low impedance port (current port, or herein referred to as "iPort") providing a bidirectional current sink/source mid-channel with a very low input impedance at a low saturation voltage, and additionally connecting reciprocal iFETs pairs of opposite "conductivity type" (P-type & N-type) interconnected to take advantage of their complementary nature to operate as a team and symmetry to self-bias near the midpoint between power supplies. In addition, the relative strength of the first and second channels of the iFETs can be adjusted (threshold choice, relative sizing, and doping profiles) to tailor the gain, speed, quiescent current and input impedance of such a complementary iFET (or CiFET) compound device of the present invention.

The iFET, with its iPort provides an uncommon and unexpected solution to the compensation problem, and then continues to provide new or alternative solutions to other old problems, exceeding industry expectations. The advantages of operating circuits in "weak inversion" have long been known but, so also have the problems. The CiFET enables circuits to exploit the high gain and wider dynamic range available in "weak inversion," without sacrificing superior speed performance. The CiFET compound device provides a standard active IC gain device that is superior to ordinary analog MOSETs making digital ICs host analog functionality.

It is not a tradeoff.

The following is a list of some of the unusual aspects of a CiFET based circuit, including, but not limited to:
Operates at low power supply voltage;
High gain;
Extremely linear;
Very high speed (wide band);
Self-Biasing;
Low noise;
Quick recovery (DC);
Uses all digital parts and processes;
iPorts respond to charge (things in nature are charge based) rather than Volts across a Resistance; and
iPort has wide dynamic range with constant gain in an open loop.

Referring to FIGS. 2a and 2b, according to a preferred embodiment of the present invention, it provides a current FET (or iFET) 200, which is comprised of substrate 26a or 26b, source terminal 24a or 24b. and drain terminal 29a or 29b, defining therebetween two channels 23a and 25a, or 23b and 25b on the substrate 26a or 26b, respectively, typically the first (source channel 23a, or 23b) is connected to the power supply (not shown) while the second (drain channel 25a, or 25b) connects to the load (not shown). The substrate 26a or 26b is N- or P-type. The two channels, source and drain channels 23a and 25a, or 23b and 25b, respectively, are connected to each other as shown in FIGS. 2a, and 2b, at the iPort control terminal 21a or 21b, and the channels 23a and 25a, or 23b and 25b, share a common gate control terminal 27a or 27b, respectively. This configuration means that the iFET 200 has more than one control input terminal.

The gate control terminal 27a or 27b operates like a conventional MOSFET insulated gate, with its high input impedance and a characteristic Trans-conductance ($g_m$) transfer function. Typical values of ($g_m$) for a small-signal MOSFET transistor are 1 to 30 millisiemens (1 millisiemen=1/1K-ohm) each, a measure of Trans-conductance.

The iPort control terminal 21a or 21b is low impedance with respect to the source terminal 24a or 24b, and has a transfer function that looks more like beta (β) of a bipolar transistor, but is actually Trans-resistance (or $r_m$), or more generally, especially at high frequencies, Trans-impedance, measured in K-ohms, where the output voltage is a consequence of an input current. Depending on the channel sizing ratio of the CiFET the typical resistance values (or values of $r_m$) for a small-signal iFET transistor 200 are from 1 KΩ to 4 MΩ, a measure of Trans-resistance. Current input to voltage output (Trans-impedance) is the basis for the assertion that 1 μA in will yield an output of 100 mV (or a gain of 100,000:1) at a large signal level, or 1 pA in will yield an output of 100 nanoV (or a gain of 100,000:1) in a low noise amplifier (or LNA) (both results from the same circuit and linear over this dynamic range).

These values have been shown to remain true for a single minimum sized iFET, with inputs from 1 pico-ampere to 10 micro-amperes, using the same circuit in simulation. In 180 nm CMOS construction the noise floor limits measurements below about 10 pico-amps. iFETS can be constructed with different length to width proportions with very predictably differing results.

High gain, uncharacteristic or surprising results differing from the state of the art designs, is the result of the "Weak inversion" characteristics of the source channel 23b of the iFET 200 operating in a highly ionized super-saturation mode of FIG. 2b.

Speed in this super-saturated source channel 23b is not limited by the transit time of carriers along the channel 23b, but the high concentration of ionized charge carriers in the active channel only have to push the surrounding charge a little as charge is either added or removed from the channel 23b by means of the iPort control terminal 21b, resulting in a diffusion current which is defined by exponential relationship as has been realized when a MOSFET is operated in weak-inversion. This is in contrast to an electric field causing the charge to transit the channel, which is a square-law function of the gate control voltage. In this configuration, speed is faster than logic built from the same fundamental transistors and unhampered by the "Weak inversion" stage that has higher gains like bipolar transistors. As opposed to bipolar transistors, control current can go either in or out of the iPort control terminal 21b as well as operate with no iPort current, which is useful for creating a self-bias operating point.

Lower noise is facilitated by the self-biased operating point. Here the potential at drain terminal 29a or 29b is the same as potential at the gate control terminal 27a or 27b, greatly reducing the pinch-off effect found in conventional analog circuit designs.

The iFET 200, because of the common gate connection over the source channel 23a/23b and the drain channel 25a/25b, places a higher than expected voltage on the gate control terminal 27a/27b (or GS) of the source terminal 24a/24b or source channel 23a/23b. This higher than expected voltage is responsible for a much thicker and deeper (lower resistance highly ionized) conduction layer, allowing the majority of carriers to avoid the traps in the surface of the crystal lattice, hence—much lower noise similar to the manner in which a junction field effect transistor (or j-FET) conduction channel is located below the surface.

Trans-resistance ($r_m$) is the "dual" of Trans-conductance ($g_m$). When you look up Trans-resistance, most of the references are to inductors and capacitors, suggesting that the iFET may be useful in synthesizing inductors.

The iFET works in the following ways: A low noise amplifier requires a low impedance channel. A low impedance channel is low in voltage gain while high in current gain. To establish voltage gain, a second stage, operating as a current to voltage converter, is required. A cascaded pair provides such a configuration. Biasing requirements for a cascaded pair preclude its use at low voltage unless a solution for the biasing problem is found. The iFET provides the solution to this problem through self-biasing of a complementary pair. The impedance of the channel can be designed to accommodate the impedance of the particular signal source driving it (see later section on ratio).

Regarding FETs in general, carriers are attracted to the surface by the gate field, a low gate voltage creates a thin surface-layer on the channel (where the conductivity takes place) while a higher gate voltage creates a thicker under-layer. The thin layer of carriers is impeded by the non-uniform surface defects resulting in electrical noise, while a thicker layer of carriers finds a smoother path below the surface, thus reducing total electrical noise. This indicates that higher gate voltage translates to lower noise.

Referring to FIG. 2b, in the iFET 200, the electric field created by the gate voltage Vg on the gate control terminal 27b causes carriers to rise from the substrate 26b into the source channel 23b region converting the semiconductor material to a conductor with a relatively large number of carriers per volume or at saturation, thus establishing a level of conductivity.

Injection current $I_{inj}$ introduced into the iPort control terminal 21b increases the diffused charge (number of carriers per volume) over and in the source channel 23b, thus making the source channel 23b even more conductive. The rate of conductivity change is exponential, similar to that found in "weak inversion." This exponential rate of conductivity change is due to the low voltage gradient along the source channel 23b (source terminal 24b to iPort control terminal 21b voltage gradient).

The iFET exponential relationship between source channel 23b charge and gate voltage 27b provides access to log functionality, where the addition of two log functions is equivalent to multiplication. A reverse anti-log, or reverse-exponential, operation recovers the analog output through the opposing complementary iFET channel. Such exponential relationship may be used for various low noise amplifier applications. The exponential relationship is also responsible for the wider dynamic range of these iFET circuits.

Again, referring to the source region in FIG. 2a, removing charge from the gate control terminal 27a or/and iPort control terminal 21a (number of carriers per volume) results in reduced conductivity of the semiconductor material in the source channel 23a. In this respect, the iPort control terminal 21a-to-source terminal 24a connection operates in a manner similar to the base-region of a bipolar transistor (which is exponential): the more control current to the iPort control terminal 21a, the more the device conductivity ($g_m$).

The drain channel 25a of the iFET 200 of FIG. 2a operates more like a conventional FET, in that the thickness of the drain channel 25a is greater near the iPort control terminal 21a (same thickness as the source channel 23a) and tapers as it reaches its diffusion region around the drain terminal 29a (the decreasing voltage differential between drain channel 25a and gate control terminal 27a diminishes the field) establishing the output resistance of the transistor as set by the gate voltage $V_g$. A lower drain voltage $V_g$ (close to the voltage found on the gate), decreases the drain channel output resistance (thicker channel at the drain diffusion). Along with a thicker conduction layer, this lower drain channel resistance results in lower noise and a high output drive capability to establish the desired drain voltage at the drain 29a with a low impedance drive offered by the thick conduction layer.

Diffusion regions around the source region 24a of the iFET 200, operating at a low voltage, has lower voltage gain but it also has low noise. Diffusion region around the drain terminal 29a, operating at a higher voltage, provides the desired voltage gain with a minimal noise contribution, due to the drain voltage being the same as the gate voltage $V_g$. This voltage equality is contributed by a unique biasing construct, to be explained hereinafter.

FIG. 2b further shows iFET channel charge distributions, according to the present invention, with their operating points or iFET's characteristics without iPort injection current graphed in FIG. 2c, where the source channel current level 24c and voltage level 25c at the drain channel 25b with no input current is applied to iPort control terminal 21b. Slope 26c represents drain channel 25b am dots transresistance $r_m$, while slope 23c is for source channel 23b which is super saturated, and iPort input resistance $R_{in}$. FIG. 2d illustrates iFET's V-I characteristics with iPort injection current, where slop 26d represents drain channel 25b and its transresistance $r_m$, while slope 23d is for source channel 23b which is super saturated, and iPort input resistance $R_{in}$. It is to be noted that how a small amount 21d of iPort current greatly disturbs the drain channel output voltage $V_{out}$ 25d. As it can be seen, $V_{out}$ can swig to almost at full power supply ($V_{dd}$). This is the converse or dual of a normal voltage controlled current source use of the MOS device where large changes in the drain-to-source voltage yield minimal changes in the drain current during saturation as shown in FIG. 2d. This gives an analog IC designer insight as to the usefulness of the iFET as an amplifier which does not require a typical large, bulky analog planar transistor for the needed transconductance to obtain gain. Instead, the NiFET in a current-controlled voltage source configuration uses transresistance to boost the gain of the MOS-based device to new heights.

Non-Inverting Nature

Regarding the iPort control terminal, in the case of both the N-channel and P-channel devices, a positive current into the iPort control terminal displaces an equivalent current coming in through the drain channel, causing the drain (output) connection to move in a positive voltage direction—thus the non-Inverting nature of the iPort input.

The iPorts also operate as a current inverter as opposed to a conventional current mirror.

Interestingly, unlike other semiconductor devices, a negative current can be extracted from the iPort, causing a drain (output) shift in the negative direction. Zero input current is also valid.

Proper Bias

An iFET 200 (as shown in FIG. 2b) has both gates connected together and requires a proper bias voltage on the gate to establish the desired operating point.

Symmetry

A P-channel device can be constructed and behaves in a similar fashion to its N-channel counterpart.

It should be emphasized that while the gate input is inverted with respect to the drain, the iPort is NOT inverted. The CiFET Amplifier is the Basic Analog-in-DIGITAL Building Block:

While a single iFET has interesting characteristics on its own, a complementary pair of iFETs (or CiFET) prove to be much more beneficial. Using the opposite semiconductor type iFET as a load device conveniently provides the opposing iFET its bias and in addition has the advantage of balancing out (linearizing) the inherent non-linarites of MOSFET operation. For instance, the high-gain exponential characteristics of the source channel's super-saturated operation are linearized over an extremely wide dynamic range.

The resulting complementary device (the seminal CiFET cell) is arguably the highest possible power gain-bandwidth MOSFET amplifier stage possible. For instance, looking into either iPort, the super-saturated source channel input impedance is a relatively low number constant resistance. This converts any input current into a small input voltage, which calculates out to be a very high voltage gain transfer function implemented by the high number $r_m$ trans-resistance. In addition, the sub-surface operation of the super-saturated source channel may operate with the lowest noise possible for any MOS device. The drain channel also maximally operates below its surface defects for low noise. In the end it is all about signal-to-noise ratio.

FIG. 3a presents the seminal CiFET symbol and FIGS. 3b and 3c show a diagrammatically similar physical layout abstraction; FIG. 3d shows three (3) dimensional perspective view and FIG. 3e illustrates cross-sectional view at Section AA in FIG. 3d; and FIGS. 3f and 3g illustrate iPort control terminal behavioral model of a CiFET device of the present invention, self-bias schematic, and symbol therefor of a complementary pair of iFET of the present invention, which is a radical improvement from the state of the art in high gain, high precision, small scale, analog primitive building blocks. The complementary pairs of iFETs are built entirely from logic components, without analog extensions, while enabling scaling and portability. Both the footprint and the power consumption per gain/bandwidth are drastically reduced from the present state of the art, while retaining superior noise performance.

Referring to FIG. 3a, the complementary pair of iFETs (or CiFET) 300 comprises P-type iFET (or PiFET) 301 and N-type iFET (or NiFET) 302, comprising input terminal 30a connected to both the gate control terminal 37p of PiFET 301 and the gate control terminal 37n of NiFET 302, function as the common gate terminal 30a. CiFET 300 receives power, Power – and Power +, where Power – is connected to the source terminal of NiFET 302 and Power + is connected to the source terminal of PiFET 301. Each of PiFET 301 and NiFET 302 comprises iPort control terminals (31a and 32a) for receiving injection current. The drain terminal of PiFET 301 and NiFET 302 are combined to provide output 39a.

FIG. 3b stretches out the CiFET 300 PiFET and NiFET devices 301 and 302 of FIG. 3a to visually correlate to the physical layout abstract of FIG. 3c.

Referring to FIG. 3c, the CiFET 300 comprising PiFET 301 and NiFET 302, laid out on the substrate (or body B+ and B– respectively) like a mirror image along well border WB' shown therein; PiFET 301 comprises source terminal S+, drain terminal D+, and iPort control terminal Pi, defining source+ channel 34c between the source terminal S+ and the iPort control terminal Pi diffusion region 32c, and drain channel 36c between the drain terminal D+ and the iPort control terminal Pi diffusion region 32c. NiFET 302 comprises source terminal S–, drain terminal D–, and iPort control terminal Ni, defining source – channel 33c between the source terminal S– and the iPort control terminal Ni diffusion region 31c, and drain channel 35c between the drain terminal D– and the iPort control terminal Ni diffusion region 31c. CiFET 300 further comprises a common gate terminal 30c over source+ channel 34c, drain+ channel 36c, source – channel 33c and drain – channel 35c. Accordingly, the common gate terminal 30c is capacitively coupled to the channels 34c, 36c, 35c, and 33c.

FIG. 3d is a 3-Dimensional representation of the CiFET physical layout of FIG. 3c and FIG. 3e is a cross-section AA of FIG. 3d. The corresponding pinpoint numbers relate the same feature between each of FIG. 3a, 3b, 3c, 3d, 3e, 3f, and 3g where the same feature is represented by the reference number with the figure letter annexed. FIG. 3h shows a symbol diagram for a CiFET device of the present invention. FIGS. 3d and 3e further points out the active channel charge conduction regions 34d, 34e, 36d, 36e, 33d, 33e, 35d, and 35e that exist for the biased CiFET which has its gate voltage at about half the difference between that on the S+ and S– terminals.

In many analog circuits, biasing is a problem. Using iFETs in complementary pairs (31g & 32g) as shown in FIG. 3g allows them to "self-bias" (38g), thus eliminating drift problems and additionally, the amplifier finds the maximum gain point on its operating curve.

In the "Behavioral Model" as shown in FIG. 3f, the current at the iPort control terminals, NiPort 33f and PiPort 34f is converted to a voltage by a trans-resistance ($r_m$), whose value determines the gain. Self-bias path 38f to $V_{input}$ 30f is provided for eliminating drift problems. This "Trans-resistance" ($r_m$) is established by the ratio of the "drain channel" to "source channel" strength, and remains constant throughout the entire operational range. Here the iFET operation is derived from different current densities in the source and drain channels, which is similar to a dual of the band-gap method of generating a reference voltage made by running the same current value through a single transistor and a parallel combination of multiple instances of an identical transistor. Simulation has shown this resistance ($r_m$) to typically be in the range of 1KΩ to 4MΩ with a typical value of 100KΩ, as set by the relative channel sizing. $r_m$ is the dual of gm.

The output ($V_{out}$ 39f) is a low-impedance source follower common-gate FET configuration that can deliver its voltage with the necessary current to drive the following circuit.

The iPort input is a constant low resistance termination (related to $r_m$ but much lower) with a constant offset voltage, CTAT Ref, PTAT Ref, of about 1 mV to 100 mV from their respective power supply rail. This offset voltage is a "band-gap" reference, established by the ratio of the "drain channel" to "source channel" strength.

A standard CiFET compound device cell can be physically constructed and instantiated like a logic cell for designing analog. Normally this is the only active circuit component needed. Like a transistor, but the CiFET cell does everything needed for an active component.

How then is the proper bias voltage produced? The simplest way of generating the bias voltage is to use iFETs in complementary pairs, NiFET 31g and PiFET 32g, creating an inverting device as shown in FIG. 3g, and then using the output 39g to provide negative feedback 38g to the input 30g. The CiFET compound device will "self-bias" at a point between the power supplies, where the gain is maximized and the speed or slew rate is poised for its most rapid changes. At this self-bias voltage point, the current through both of the complementary iFET devices 31g and 32g is exactly equal, there is no other DC current path for the PiFET (32g) drain except into the NiFET (31g) drain, and thus a specific gate voltage is established for this equality of currents (or conductivity). Also since both iFETs 31g and 32g have the same current, the pull-up ability is exactly equal to the pull-down ability, which defines the maximum slew rate bias point. The current at the iPort control terminals, NiPort 33g and PiPort 34g is, then, converted to a voltage by a trans-resistance ($r_m$) (not shown), whose value determines the gain.

Since the complementary pair of iFETs 31g and 32g is self-biased, any parametric factors are auto-compensated, for changes in operating environment. Because of inherent matching between adjacent parts on an IC, the bias generator can be used to bias other iFETs nearby. The real-time self-biasing circuit corrects for parametric changes (in various forms).

Each of the transistors in an inverter of the present invention acts as a "dynamic" load for its complement, allowing the gate voltage to be significantly higher than the traditional bias point of an analog circuit gate. With the complementary iFET compound device's higher than normal gate voltage, the source conduction channel is deep, yielding lower noise.

The dominant noise source in a traditional analog circuit is related to "pinch-off." Biasing the drain (or output) at the same voltage as the gate (zero differential) causes the drain conduction channel to avoid the channel pinch-off (shallow channel) phenomena usually encountered in analog circuits. Another way of stating this is: a transistor gets noisier as the drain approaches its design maximum voltage, the self-biased inverter operates its transistors at around half the design maximum voltage and the gate is at the same voltage as the drain (zero differential), therefore the self-biased inverter is MUCH quieter.

The operation of the CiFET amplifier differs from the operation of a conventional analog amplifier, with its current mirror loads, in that:

The "Source" channel has an extremely small (~100 mv) voltage from source terminal to iPort control terminal while the "Gate terminal" is at ~½ $V_{supply}$. This puts the iFET Source channel into "Super-Saturation," a condition similar to weak inversion but with high Gate overdrive. Gate overdrives resulting in an unusually thick conduction layer and along with a low Source to iPort voltage resulting in that conduction layer remaining thick all the way along the channel. Notice the differences in the thickness between the conduction channel 10s in FIG. 1e from that of 23b in FIG. 2b.

The "Drain" channel 25b operates with its' drain terminal 29b at ~½ Vmax, greatly reducing the pinch-off (and DIBBL) effect. This reduced pinch-off condition is further enhanced by the fact that the "Gate terminal" is operated at ~½ $V_{supply}$ (same as ½ Vmax), meaning no potential difference between the Drain 29b and the Gate 27b.

Another important aspect of the CiFET compound device is its current input that frees it from the speed robing effects of parasitic capacitance.

This subtle but significant difference is one of the enabling features that makes weak inversion work and gives the complementary iFET amplifier its superior low noise, wider dynamic range, and speed advantages.

MOSFETs do not make particularly good amplifiers compared to equivalent bipolar circuits. They have limited gain, they are noisy, and their high impedance makes them slow.

Bipolar Diff-Amps developed to the point where the input offset is pretty good, but the move to CMOS never really delivered as good a result.

It has long been known that superior performance can be had from CMOS operated in weak inversion but complications arising from high impedance, due to impractically low currents, preclude taking advantage of the superior gain (equivalent to that of bipolar transistors), dynamic range (exceeding that of bipolar transistors), and logarithmic performance (allowing numerous decades of amplification) found in weak inversion. Because of weak inversion the CiFET brings the noise benefits of majority carriers in a deep channel found in junction-FETs to the MOSFET.

While a MOSFET in weak inversion, working into a current source load, delivers a logarithmic transfer function, the same MOSFET working into an anti-log load cancels the nonlinearity, yielding a perfectly linear transfer function. The CiFET amplifier is such a circuit, i.e.: log input, antilog load, perfectly linear, wide dynamic range, low noise. The low noise is a consequence of the biasing, where the source channel gate potential is unusually high and the potential across the source channel itself is maintained at near zero volts. The drain channel is a level shifter, maintaining a very low voltage on the source channel while delivering high amplitude signal swings at the output.

The CiFET amplifier, implemented in a closed-loop, sample-data block delivers near perfect performance in terms of input offset because of its "flying capacitor" input. The CiFET amplifier, implemented in an open-loop, delivers unexpected levels of sensitivity (gain>1 million), even in the presence of high levels of background, this because of the extreme dynamic range.

Taking Advantage of the Doping Profile and Ratioing:

Traditionally engineers have avoided using digital logic in an analog configuration because it was believed to be unacceptably nonlinear and was difficult to bias. Digital logic also sacrifices drive symmetry for compactness. Restoring the symmetry through proper device ratioing (~3:1 p:n width) improves linearity, increases noise immunity, and maximizes dynamic range. Self-biasing solves the bias problem.

FIG. 1q depicts the basic symbol and 3-dimensional view of the MOS transistor structure in saturation. The generic planar MOSFET here is shown with a typical longer/wider channel used in customary analog applications. The FET symbol and structure shown applies to either n- or p-type planar transistors which can further be related and applied to the wrapped-gate finFET structure as desired. Note that the FET has four ports including the gate (g) 17q, drain (d) 19q, source (s) 14q, and body (b) 16q. Typically, voltage is applied as input to the high-resistance gate port 17q, while a voltage or current may be applied to the physically similar (and interchangeable) drain 19q and source ports 14q. The bulk/body port 16q is generally attached to the lowest (or low) voltage potential for n-type FETs and highest (or high) voltage potential for p-type FETs to control/prevent forward biasing of the bulk-source junction and to give the lowest $V_g$s relative to the supply voltage for normal operation (although there are exceptions and special uses for the bulk, they will not be covered here). Additionally, the planar 3-dimensional MOSFET structure in FIG. 1q is shown with a wider width, W, and longer length, L, commonly used for analog circuits, along with a channel in the pinch-off saturation region.

In order to maintain a high intrinsic gain, the MOSFET requires a high output impedance. This is obtained through long channel lengths necessary for high $r_o=R_{out}$. Since $g_m$ is proportional to the W/L ratio of the MOSFET, in order to keep $g_m$ high when the channel is long, the channel must also be proportionally wider. Gain here is $\sim g_m R_L/R_{out}$. As the IC process shrinks, $g_m$ increases, but $R_{out}$ decreases faster, ruling out short channel lengths for analog. This is why as IC processes shrink analog transistors do not scale accordingly in the newest double-digit CMOS technologies. Also, it is to be noted that the analog channel current travels close to the surface under the gate where the surface defect carrier traps create the characteristic MOSFET 1/f noise.

FIG. 1r shows a physical layout plan of an array of Fin field effect transistors (FinFET) of prior art. Sources 14r and drains 19r are stacked and forms fins, and an array of gates 17r are disposed therebetween to form FinFETs 12r. Zoomed in view of the circle Z in FIG. 1r, which shows one of prior art three (3) dimensional perspective view of FinFET 12r is shown in FIG. 1s.

FIG. 1t shows a plot representing intrinsic gain scaling of nMOS transistor of prior art. As it can be seen, the steadily decreasing intrinsic gain of nMOS transistors alerts analog designers of impending difficulty that they face when attempting to scale the design of an amplifier that may have run efficiently at 65 nm or 90 nm to the 14 nm CMOS process, where it will most likely fail. Therefore, other methodologies which depart from conventional procedures must be explored in order to find a viable tactic to harness inherent transistor gain in the newer ultra-deep sub-μm CMOS technologies.

FinFETs have short nanoscale channel lengths that increase $g_m$ while lowering the drain output resistance of the bare field effect transistor. Higher $g_m$ provides better control over channel conductance, but the close proximity of the drain to the source makes them talk to each other making the output resistance low. This yields a low intrinsic gain of the MOSFET at nanoscale dimensions. Conversely the CiFET is a low output resistance device and improves with deep scaling.

According to the preferred embodiment of the present invention, noise figures can be particularly optimized on front end amplifiers through proper ratioing. The iFET's electrical characteristics can be enhanced by modifying the combined and relative strength of the source and drain channels, without modifying the available IC process (without analog extensions).

There are several approaches to realizing this optimization (adjusting length, width, and threshold among others).

Nearly any source and drain channel size will make a functional iFET, but varying the individual iFET channel size, both relative and cumulative, increases the iFET performance depending on the objective.

Fundamentally:

Lower iPort impedance is achieved with a lower current density (wider) source channel as compared to the drain channel.

Higher voltage gain is obtained through a higher resistance (longer) drain channel as compared to the source channel, which makes a higher output impedance looking into the drain terminal (iFET Voltage gain=Drain channel resistance/Source channel resistance).

The power verses speed tradeoff is controlled by the cumulative sum of all of the channel strengths used to set the idle current through the complementary iFET amplifier. This establishes the output slew rate (or output drive capability).

To be clear, the strength of the iFET channels are a function of the individual channel width and lengths, as well as their thresholds. Each of the iFET channels can have individually selected sizes and/or threshold relationships to the other channel.

FIG. 2e shows various conventions/symbols for iFET devices of the present invention. Symbols 22g and 24g for PiFET, and symbols for NiFET 21g and 23g are shown. For example, NiFET 21g or 23g represents an n-type iFET (or NiFET) with shorter source channel as previously described, and thus, as it can be seen, NiPort is shown near the Source. An example sizing of the NiFET device 21g may be, for drain channel with $W_{min}/2 \times L_{min}$ while the source channel is $2 \times W_{min}/L_{min}$ for a combined iFET drain:source ratio of 4. This NiFET would allow for lower input iPort termination resistance targeting current gain objectives, which is useful for high gain current input trans-impedance amplifier applications. Similarly, PiFET 22g or 24g is shown to have PiPort near the Source as well which signifies wider source channel. Example sizing of the PiFET device 22g may be, for drain channel with $3 \times W_{min}/2 \times L_{min}$, while the source channel may be $6 \times W_{min}/L_{min}$ for combined iFET drain:source ratio also of 4, but with 3× PiFET to NiFET ratio adjusting for similar PiFET to NiFET overall strength, roughly balancing P to N total channel conductance.

While iFET amplifiers can be constructed with minimum sized devices which do provide ample current at the output for very fast response and high accuracy, care must be exercised so that the complementary iFET amplifier does not pass too much current, subjecting it to mechanical failure. The physical layout requires enough contacts and metal for the required DC and transient currents.

Referring to a current field-effect transistor (iFET) in FIGS. 2a and 2b; separating the source channel 23a/23b gate s27a/s27b from the drain channel 25a/25b gate diffusion region d27a/d27b of the iFET 200, the super-saturation 28b level of the iFET source channel 23a/23b can be electrically controlled via independently adjusting the source gate s27a/s27b voltage over the source channel s27a/s27b. In order to enable independent gate control, the gate 27a/27b is split as shown in FIGS. 4a and 4c.

Super-saturation current field transistor (or xiFET) includes a source terminal 44a, a drain terminal 49a, iPort (or diffusion) terminal 41a on a body 46a. A drain channel 45a is defined between iPort terminal 41a and the drain terminal 49a, and source channel 43a between the iPort terminal 41a and the source terminal 44a. A first gate terminal 47a1 is capacitively coupled over the drain channel 45a; while the second gate terminal 47a2 is capacitively coupled over the source channel 43a. This iFET improvement in xiFET 400 provides, instead of the common gate 27a/27b or a method of the iFET illustrated in FIG. 2a/2b, means to have its source channel 43a (as shown in FIGS. 4a and 4c) be at its maximum saturation-limit charge distribution. This maximum saturation limit provides its low impedance iPort control terminal 41a with the lowest possible input impedance for a given channel sizing ratio. Here the source channel gate 47a2 voltage Vsg is provided by an independent voltage source v47a2.

By adjusting voltage Vsg at the gate s47as with an independent signal source v47a2, the iPort input impedance can be electrically controlled. This is particularly useful for matching the input impedance of an antenna or transmission line to minimize reflections and maximize input power transfer into the iPort 41a. This additional source channel gate input also can be used to control the iPort trans-impedance gain, establishing a voltage controlled amplifier gain application. Also the source channel gate input 47a2 can be used to turn the xiFET 400 off and on rapidly to cut off its drain current when not needed in order to save power. The xiFET turn-on is nearly instantaneous in that the bias point at the iPort 41a is low impedance and does not need to settle as compared with conventional analog current mirrors. When turned off, the xiFET output is high impedance, thus when multiple xiFET voltage outputs are tied together and individual xiFETs are enabled, an array of xiFETs can be used as an analog multiplexer.

This property is especially useful in focal plane array (FPA) readouts. Here the FPA core is not changed at all, but only the readout line drive voltages are controlled differently to operate the existing two transistor pixel readout transistors as an xiFET. The low noise, high speed, high dynamic range, low power properties work in concert to create a high-quality FPA.

FIG. 4b shows its corresponding symbol s400 of the circuit 400 shown in FIGS. 4a and 4c, including source terminal s44, drain terminal s49, iPort s41, body s46, first gate s47a and second gate s47b.

FIG. 5 shows a schematic diagram of a complementary pair xiFET (or CxiFET) 500 in accordance with the present invention. CxiFET 500 includes n-type xiFET (or NxiFET) 501 and p-type xiFET (or PxiFET) 502. The first gate terminals of NxiFET 501 and PxiFET 502 are connected together to receive input 50*a*, the drain terminals of NxiFET 501 and PxiFET 502 are also connected together to form output 59*a*. The source terminal of NxiFET 501 receives negative power supply and the source terminal of PxiFET 502 receives positive power supply. Providing this second gate control inputs 57−a and 57+a in this complementary configuration 500 as shown in FIG. 5 affords similar linearization to that of a CiFET device structure as previously discussed.

When either of the second gate terminals 57−a, 57+a are taken to their respective power supply rail, the CxiFET 501, 502 is turned OFF, thus saving power when the amplifier is not in use. Because of the large and uniform distribution of source channel ionized charge carriers, and low channel/ iPort voltage change between OFF to saturated, and back OFF is extremely fast, approaching logic speed for analog signals. The source channel quickly cuts OFF or immediately reaches its stable bias point. The low resistance and minimal voltage change drive rapid exponential settling to a stable bias point.

In addition, when either or both second gates 57−a, 57+a are taken to an intermediate voltage, the current through the CxiFET device 500 from Power to Power- and trans-impedance $r_m$ gain is controlled, making gain and power consumption verses speed electrically controllable. When these source channel gates are switched to the common gate voltage, the CxiFET becomes a CiFET.

When the CxiFET is used for charge-coupled logic, inputs on these second gates 57−a, 57+a can be used to turn the logic ON or OFF as well as strobe the logic state with a clock as appropriate.

It can also be a cross-coupled latch control where a pulse of charge flips the latch and due to the low voltage operating properties the latched state can be held with almost zero current consumption as shown in FIG. 7*c*. The source channel voltages can be used to electrically adjust the speed:power of the CxiFET operation to optimize power in real time. The analog voltage signals on the source channel gates are multiplied by the analog current signal on the iPorts yielding an analog multiplier with a wide dynamic range and the ability to sum the output derived from the PxiFET with the output from the NxiFET.

In the "iFET," the source channel is tied to a common, single gate. In the "xiFET," the source channel gate is taken to an independent normally higher voltage than the drain channel gate voltage, to increase the source channel's supersaturation level. Thus the input resistance at the iPort is controlled by this separate source channel's gate voltage input. This configuration is tied to the proportional-to-absolute temperature (or PTAT)/complementary-to-absolute temperature (or CTAT) coefficient of the termination voltage of the iPort, as well as the magnitude of the trans-impedance gain ($r_m$). It can be modeled as two separate FET transistors, with an iPort current input in the connection between their series hookup. Using this as a well-behaved linear analog bi-directional current/charge input/output is unique, which leads to a methodology of creating a trans-impedance MOSFET with separate electrically controllable $r_m$ gain and input resistance and input termination voltage. This is a method of adjusting the PTAT/CTAT iPort reference voltages and temperature properties electrically.

In general, the iFET/CiFET and the xiFET/CxiFETs are a new type of analog circuit element, or type, that operates in a charge-injection mode, yielding a trans-resistance amplifier (or more generally a trans-impedance amplifier) which creates a unique, predictable, parametrically stable, and very useful analog gain block. The advantage of this device is its stability, linearity, high-gain, high-speed, low-noise, unprecedented low voltage operation not limited by threshold voltage, high output drive, low power, small, and built out of digital-only IC parts.

Various degrees of complementary cancellation result from the opposite diffusion types of symmetry.

This yields an extremely linear transfer function obtained by the same circuit in the opposite diffusion type creating the complementary output signal drive. Thus, non-linearity and other errors cancel out at the output. We do not know of any analog circuit that considers this except a CMOS inverter with balanced transistors when it is roughly optimized for analog applications.

FIG. 6 is a physical layout abstraction of a CxiFET 500 including NxiFET 501 and PxiFET 502 joined together over well border W, and FIG. 7*a* is a three dimensional representation thereof, and FIG. 7*b* is a cross-sectional view at section AA in FIG. 7*a*. This layout corresponds to the schematic diagram shown in FIG. 5. Input 50*d* is connected to the common gate 57*d*, which is in communication with the first gate 57*dn* of NxiFET 501, capacitively coupled to drain channel 55*d* between the drain terminal d55*d* and NiPort 51*d*; and the first gate 57*dp* of PxiFET 502, which is capacitively coupled to drain channel 56*d* between the drain terminal d56*d* and PiPort 52*d*. Second gate terminal 57−a of NxiFET 501 is capacitively coupled to source channel 53*d* between source terminal s53*d* and NiPort 51*d*; while second gate terminal 57+d of PxiFET 502 is capacitively coupled to source channel 54*d* between source terminal s52*d* and PiPort 52*d*. Drain terminals d55*d* and d56*d* of NxiFET 501 and PxiFET 502 are connected together to form voltage output 59*d*.

FIG. 7*c* shows power consumption of a CxiFET. Nanoscale processes will be lower, primarily as a function of the small CMOS geometry and threshold voltage reduction with IC process shrink.

Noise Advantages:

In the end, it comes down to signal-to-noise ratio. Low power supply voltage requirements in ultra-deep-sub-μm IC processes limit the maximum signal swing to a much smaller number than most analog designers are used to. So with a smaller signal, the noise must be equally small in order to maintain the desired signal to noise ratio. It is imperative that noise issues be reduced. This iFET amplifier technology not only reduces noise by an amount as would be necessary, but performs far beyond expectations, delivering ultra-quiet front ends.

1/f noise in the source channel is reduced because the self-bias scheme provides a high field strength on the source channel's gate, forcing carriers in the channel to operate below the surface where there is a smoother path (fewer obstructions) than along the surface where crystal lattice defects interfere.

1/f noise in the drain channel is also low. Unlike conventional analog designs, the gate is self-biased at the half-way point between the power supply rails as is the drain, while the iPort is within ~100 millivolts of the power rail. With the high electric field along the drain channel, and the gate voltage equal to the drain terminal voltage, the carriers are constrained to flow mostly below the channel surface. This keeps the drain channel out of pinched off conditions, where unwanted 1/f noise would be generated.

Resistor noise is reduced because the self-bias configuration puts the complementary pair at its lowest channel resistance operating point. Resistance is caused by collisions, between carriers and the surrounding atoms in the conductor. The lower the resistance is, the fewer the collisions are.

Wide band noise (white-noise) would always be an issue in high gain for high frequency circuits. While conventional designs adjust the gate voltage to establish suitable operating point(s), the designs of the present invention establish the gate voltage at the optimum point (the "sweet-spot") and then adjust the load to establish the desired operating point. This approach establishes a higher quiescent current where (for reasons explained above) higher current density circuits have lower wide band noise.

High common mode power supply rejection is inherent in the complementary iFET circuit of the present invention. Signals are with respect to the mid-point instead of being with respect to one of the power supply rails, (similar to an op-amp with its "virtual" ground). Power supply noise is from one rail to the other, equal and opposite in phase with respect to each other; thus canceling around the mid-point.

Ground-Loop noise is diminished because the circuit ground is "virtual" (just like in many op-amp circuits), rather than ground being one or the other power supply connections . . . . In the closed-loop case, "Flying capacitors" (or "input voltage sampling capacitors") are employed. With "flying capacitors" there is no direct electrical connection between stages, so there is no common ground; virtual or otherwise. The use of "differential decoupling" (flying capacitors) offers transformer like isolation between stages, with the compactness of integrated circuit elements.

Coupled noise from "parasitic induced crosstalk" increases by the square of the signal amplitude. Unintended capacitive coupling with a 1 volt signal causes a lot more trouble than with a 100 mV signal, by a factor of 100:1 (square law effect). The small voltage signals employed in the analog sections, reduce this capacitive coupled interference substantially. Nearby Digital signals will, by definition, be high amplitude (rail-to-rail). Good layout practices are still the best defense against this digital source of noise.

Additional Advantages

There are a number of additional advantages. For example, bi-directional control on the iPort means that current can flow in-to as well as out of this connection; both directions having a significant control effect on overall channel current. The iPort has about five (5) orders of magnitude more dynamic control range than the gate.

The iFET of the present invention yields an analog structure that is significantly faster than logic using the same MOS devices. This speed improvement is due to the fact that the complementary structure expresses its maximum gain (and highest quiescent current) at its natural self-bias point, midway between the power supplies.

Since the iPort voltage does not significantly change, it is immune to the R/C time constant effects of the surrounding parasitics, thus the iPort (current) input responds faster than the gate (voltage) input.

Since in most applications of the CiFET compound device of the present invention, the output voltage (drain connection point) does not vary greatly, and thus making the output immune to the R/C time constant effects of the surrounding parasitics. A logic signal is slower than analog here because logic signals have to swing from rail to rail.

Drain-induced barrier lowering or (DIBL) threshold reduction is avoided in the CiFET compound device operating in the analog mode. When gain and threshold voltage is important, the drains are operating around half of the power supply voltage, thus eliminating the higher drain voltages where DIBL effects are prevalent.

FIG. 8a(1) shows a schematic diagram of a focal plane array (pixel) 80a of prior art. FIG. 8a(2) shows a schematic diagram of one array pixel portion PX80 of the focal plane array 80a shown in FIG. 8a(1). FIG. 8b shows a schematic diagram of a portion 80b of readout column of the focal plane array 80a shown in FIG. 8a(1), including source follower Q82, row select control Q83 and SW80 (SW80 is controlled by row select signal SEL80), and current source mirror Q84 and Q85.

The circuit 80a shows a single core pixel element PX80, along with the current mirror Q84 and Q85 that pulls a current 80Iload down from each of the parallel columns to bias source follower Q82 for applying the respective Pixel voltage to its column ADC U80. The row of pixels is selected by logically turning on the Row-Select MOSFET Switch Q83 by row select signal 80Rsel inside each of the selected row pixels PX80. The respective column bias currents are routed form $V_{dd}$ in each pixel through the pixel Source-Follower Q82; which in effect outputs the Photo-Diode node PD80 voltage 80aVfd, minus the operating threshold of the source follower Q82. Neither of these two Pixel transistors provide gain, they just pass the Vfd voltage 80aVfd to the long full array readout column 80RC, making the pull-up relatively stiff, but leaving the pull down weak, due to the high impedance current source output, for driving the high capacitance column bus in one direction, but not the other.

FIG. 8c(1) shows a schematic diagram of a focal plane array (pixel) PX80c using Complementary iFET/xiFET structure in accordance with the present invention; FIG. 8c(2) shows a schematic diagram of a one array pixel portion PX80c of the focal plane array 80c shown in FIG. 8c(1); and FIG. 8d shows a schematic diagram of a portion of readout column of the focal plane array shown in FIG. 8c(1). In particular, the circuit 80d shown in FIG. 8d is functionally equivalent to the circuit 80b shown in FIG. 8b. When the row select SW80d switch is at Vss, the pixel output is turned off, but when the row select 80csel is switched to the CiFET bias voltage 80cbias, the row select transistor channel now operates in the CiFET mode providing low output impedance to the readout column, which rapidly and accurately drives the column to a high resolution pixel output voltage with low noise and wide dynamic range.

As it can be seen in comparison of FIGS. 8a(1), 8a(2) and 8b to 8c(1), 8c(2), and 8d, just a trivial change using CiFET and CxiFET would allow eliminating the large bulky current mirrors and replacing them with a minimum size iFETs. The pixel core PX80/PX80c is unchanged, but just driven differently from outside the pixel array core in that the current in the source follower and row select transistors are reversed in direction. For this the pixel core metal routing for the source follower Vdd is instead connected to Vss, and the row select control line is switched to the CiFET self-biased voltage instead of Vdd for selecting pixel row readout. This assembles a fast low output impedance column driver with wide dynamic signal range and low noise. Array readout gain control may be also activated by trimming all of the FIG. 8c(1) PiPorts P84b together including FIG. 8e bias generator 80e PiPort P86b. This would provide various performance improvement over the prior art.

In FIG. 8c(1), the circuit 80c includes PiFET P84, one array pixel read out portion PX80c, and Analog to Digital converter (or ADC) U81. In PiFET P84, its source terminal P84a receives positive power supply Vdd, its iPort terminal P84b receives gain control 80cgain, gate terminal P84d receives bias 80cbias, and drain terminal is connected to the input of ADC U81 and coupled to one pixel readout circuit PX80c, which includes a photodiode PD80", a pair of FETs Q80" and Q81" and a xiFET pair Q82" and Q83" which are connected together to receive Vrst 80cVrst, Initialization signal 80cInit, exposure signal 80cExpo, and a row select signal 80cRsel for read out control. The circled regions in FIGS. 8a(2) and 8c(2) highlight the connection differences between the prior art and the current invention. As it can be seen in FIG. 8c(2), one array pixel read out portion PX80c includes an hybrid xiFET in control block 80d, which can be further and clearly seen in FIG. 8d as N85.

The equivalent circuit 80d in FIG. 8d shows a hybrid pair of a PiFET P84 and NxiFET N85 yielding CiFET amplification along with output control functionality, which is at least equivalent to the block 80b shown in FIG. 8b. Circuit 80d further includes switch SW80d, functionally representing row-select logic which is operated by a select signal 80cself for selectively coupling the gate terminal N85d of NxiFET N85 to the CiFET bias 80cbias during row activation or negative power supply Vss for deactivation. The source gate terminal N85e of NxiFET N85 reads the PIXEL voltage stored on capacitor C80d. The drain gate terminal N85d is switched from Vss when the PIXEL row is unselected to FIG. 8e CiFET bias voltage out80e for row selection. Additionally, gain can be controlled by signal 80cgain which is received at iPort terminal P84b of PiFET P84.

FIG. 8e shows a schematic diagram of gain controllable CiFET bias generator 80e for generating out80e CiFET self-bias voltage to feed 80cbias to the column pullup PiFET gates and also provides the row select voltage level used during row select by switch SW80d making the xiFET/PiFET operate similar to the seminal CiFET cell in accordance with the present invention.

The gain controllable bias generator 80e includes a complementary pair of NiFET N86 and PiFET P86, each of which includes a source terminal N86a/P86a, iPort terminal N86b/P86b, drain terminal N86c/P86c, and gate terminal N86d/P86d. The source terminal N86a of NiFET N86 receives negative power supply Vss and the source terminal P86a of PiFET P86 receives positive power supply Vdd. The iPort terminal P86b of PiFET P86 receives gain control signal gc80e. The gate terminals N86d and P86d, and the drain terminals N86c and P86c are coupled together as output out80e which is bias voltage generated by the present circuit 80e.

FIG. 9a shows a schematic diagram of a latching current comparator 900 in accordance with the present invention. The comparator 900 comprises a differential trans-impedance amplifier (CiTIA) 900m and a comparator COMP. The CiTIA 900m includes three pairs of hybrid complementary pairs of PiFET and NxiFET, including first pair of PiFET 301a and NxiFET 501a, second pair of PiFET 301b and NxiFET 501b, third pair of PiFET 301c and NxiFET 501c, and receives current inputs 70m, 71m, 72m and 73m. Each of NxiFETs 501a, 501b and 501c further includes a second diffusion terminal 500ae/500be/500ce, which receives a strobe signal 900strb in order to save power when the system is not in used. In a further preferred embodiment of the present invention, PiFET 301a, 301b and/or 301c may be replaced with PxiFET device(s) and receives the strobe signal 900strb for saving power that may otherwise be used.

The comparator COMP includes two CiFET 300a and 300b, each of which are the same as CiFET 300 shown in FIGS. 3a, 3g, etc. A first set of switches SS90a, SS90b, and SS90c close to pass through during "SETUP" phase of a control signal, and a second set of switches ES90a and ES90b, which close to pass through during "ENABLE" phase of the control signal. The comparator COMP includes a first capacitor COS90a, and a second capacitor COS90b, each having a first terminal and second terminal. The second terminal of the first capacitor, COS90a, is connected to the input of the first CiFET 300a. The output of the first CiFET 300a is capacitively coupled to the input of the second CiFET 300b. An output from the second CiFET 300b forms output 900out of the circuit 900. This capacitor COS90b stores the difference between the two CiFET 300a and 300b self-bias voltages while capacitor COS90a stores the difference between the self-bias voltage of CiFET 300a and the positive reference voltage 79m of the differential TIA 710m for comparison during the setup phase of operation.

During the "SETUP" phase of the control signal, the first and second switches SS90a, SS90b, and SS90c and ES90a and ES90b causes to couple the positive voltage output 79m of the CTIA 710m with the first terminal of the first capacitor COS90a, causes the first CiFET 300a to be self-biased by connecting its output to its input, and further causes the second CiFET 300b to be self-biased by connecting its output to its input, while the second capacitor COS90b stores any slight offset voltage difference between these two self-bias voltages.

At the beginning of the "ENABLE" phase of the control signal, the first and second switches SS90a, SS90b, and SS90c and ES90a causes the difference between the positive voltage 79m and the negative voltage 78m to be instantly coupled to the first and second terminals of the first capacitor COS90a, and through to the input of the first latch CiFET 300a input. After a brief logic buffer propagation delay, the output switch ES90b of the second CiFET 300b is closed through to the input of the first CiFET 300a forming a rapid AC positive feedback latching loop. This brief logic buffer delay allows the CiFETs 300a and 300b to start in their proper polarity direction as imposed by the difference of the TIA outputs 79m and 78m. Ideally, once the output of CiFET 300b begins to move, the positive feedback loop is closed driving the comparator latch all the way to its logical state rapidly to be passed onto the system which this comparator is embedded in.

For even greater comparator decision speed, the latching current comparator 900 may optionally have a feedforward capacitors CFF90p and CFF90n, which capacitively couple the input of the first CiFET 300a to iPorts of the second CiFET 300b.

Definitions of Terms iFET: A 4 terminal (plus body) device similar to a Field Effect Transistor but with an additional control connection that causes the device to respond to current input stimulus.

source channel: A semiconductor region between iPort diffusion and the Source diffusion. Conduction in this region is enabled by an appropriate voltage on the Gate. drain channel: A semiconductor region between Drain diffusion and the iPort diffusion.

Conduction in this region is enabled by an appropriate voltage on the Gate.

CiFET: A single stage, complementary iFET compound device shown in FIG. 3a.

super-saturation: an exponential conduction condition similar to weak inversion, but with high Gate overdrive and forced low voltage along the conduction channel. FIG. 2b #23b.

feed-forward: A technique to present a signal on an output, early on, in anticipation of the ultimate value.

self-biased: Unlike fixed-bias circuits, self-biased circuits adjust to local conditions to establish an optimum operating point.

dual: (of a theorem, expression, etc.) related to another by the interchange of pairs of variables, such as current and voltage as in "Trans-Conductance" to "Trans-Resistance."

trans-resistance: infrequently referred to as mutual resistance, is the dual of Trans-conductance. The term is a contraction of transfer resistance. It refers to the ratio between a change of the voltage at two output points and a related change of current through two input points, and is notated as $r_m$:

$$g_m = \frac{\Delta I_{out}}{\Delta V_{in}}$$

$$r_m = \frac{\Delta V_{out}}{\Delta I_{in}}$$

The SI unit for Trans-resistance is simply the ohm, as in resistance.

For small signal alternating current, the definition is simpler:

$$g_m = \frac{i_{out}}{v_{in}}$$

$$r_m = \frac{v_{out}}{i_{in}}$$

trans-impedance: similar to trans-resistance, but further includes complex variables for high frequency applications.

trans-conductance is a property of certain electronic components. Conductance is the reciprocal of resistance; Trans-conductance is the ratio of the current variation at the output to the voltage variation at the input. It is written as $g_m$. For direct current, Trans-conductance is defined as follows:

$$g_m = \frac{\Delta I_{out}}{\Delta V_{in}}$$

$$r_m = \frac{\Delta V_{out}}{\Delta I_{in}}$$

For small signal alternating current, the definition is simpler:

$$g_m = \frac{i_{out}}{v_{in}}$$

$$r_m = \frac{v_{out}}{i_{in}}$$

Trans-conductance is a contraction of transfer conductance. The old unit of conductance, the mho (ohm spelled backwards), was replaced by the SI unit, the Siemens, with the symbol S (1 siemens=1 ampere per volt).

translinear circuit: translinear circuit is a circuit that carries out its function using the translinear principle. These are current-mode circuits that can be made using transistors that obey an exponential current-voltage characteristic—this includes BJTs and CMOS transistors in weak inversion.

subthreshold conduction or subthreshold leakage or sub-threshold drain current is the current between the source and drain of a MOSFET when the transistor is in subthreshold region, or weak-inversion region, that is, for gate-to-source voltages below the threshold voltage. The terminology for various degrees of inversion is described in Tsividis. (Yannis Tsividis (1999). *Operation and Modeling of the MOS Transistor* (Second Edition ed.). New York: McGraw-Hill. p. 99. ISBN 0-07-065523-5.)

Subthreshold slope: In the subthreshold region the drain current behavior—though being controlled by the gate terminal—is similar to the exponentially increasing current of a forward biased diode. Therefore a plot of logarithmic drain current versus gate voltage with drain, source, and bulk voltages fixed will exhibit approximately log linear behavior in this MOSFET operating regime. Its slope is the subthreshold slope.

Diffusion current: Diffusion current is a current in a semiconductor caused by the diffusion of charge carriers (boles and/or electrons). Diffusion current can be in the same or opposite direction of a drift current, that is formed due to the electric field in the semiconductor. At equilibrium in a p-n junction, the forward diffusion current in the depletion region is balanced with a reverse drift current, so that the net current is zero. The diffusion current and drift current together are described by the drift-diffusion equation.

Drain-induced barrier lowering: Drain-induced barrier lowering or DIBL is a short-channel effect in MOSFETs referring originally to a reduction of threshold voltage of the transistor at higher drain voltages.

As channel length decreases, the barrier $\varphi_B$ to be surmounted by an electron from the source on its way to the drain reduces.

As channel length is reduced, the effects of DIBL in the subthreshold region (weak inversion) show up initially as a simple translation of the subthreshold current vs. gate bias curve with change in drain-voltage, which can be modeled as a simple change in threshold voltage with drain bias. However, at shorter lengths the slope of the current vs. gate bias curve is reduced, that is, it requires a larger change in gate bias to effect the same change in drain current. At extremely short lengths, the gate entirely fails to turn the device off. These effects cannot be modeled as a threshold adjustment.

DIBL also affects the current vs. drain bias curve in the active mode, causing the current to increase with drain bias, lowering the MOSFET output resistance. This increase is additional to the normal channel length modulation effect on output resistance, and cannot always be modeled as a threshold adjustment.

PSSR stands for power supply rejection ratio, defined as:

$$PSSR = 20\log_{10}\left(\frac{\Delta V_{dd}}{\Delta V_{out}}A\right) \ [dB]$$

where A is the gain of the circuit. Some manufacturers base PSSR on the offset voltage to the amplifier input and others base the PSSR on the voltage output as shown in the example equation.

What is claimed is:

1. A field effect transistor comprising:
    a. a source diffusion connected to a source terminal;
    b. a drain diffusion connected to a drain terminal;
    c. a third diffusion connected to a bidirectional current terminal (iPort), interposed between the source and drain diffusions, defining a source channel segment between the source diffusion and the third diffusion, and a drain channel segment between the drain diffusion and the third diffusion;
d. a gate capacitively coupled with the source channel segment and the drain channel segment,
wherein
a ratio of a width to a length of the source channel segment and a ratio of a width to a length of the drain channel segment are different.

2. The field effect transistor of claim 1, wherein a trans-resistance of the field effect transistor is established by a ratio of:
a. the ratio of the width and the length of the drain channel segment; and
b. the ratio of the width and the length of the source channel segment.

3. The field effect transistor of claim 2, wherein a current applied at the bidirectional current terminal is converted to a voltage by the trans-resistance.

4. A field effect transistor comprising:
a. a source diffusion connected to a source terminal;
b. a drain diffusion connected to a drain terminal;
c. an intermediate diffusion connected to an intermediate bidirectional current terminal (iPort), the intermediate diffusion interposed between the source and drain diffusions, and defining a source channel segment between the source diffusion and the intermediate diffusion, and a drain channel segment between the drain diffusion and the intermediate diffusion;
d. a first gate terminal capacitively coupled with the source channel segment; and
e. a second gate terminal capacitively coupled with the drain channel segment,
a ratio of a width to a length of the source channel segment and a ratio of a width to a length of the drain channel segment are different.

5. The field effect transistor of claim 4, wherein a trans-resistance of the field effect transistor is established by a ratio of:
a. the ratio of the width and the length of the drain channel segment; and
b. the ratio of the width and the length of the source channel segment.

6. The field effect transistor of claim 5, wherein a current applied at the bidirectional current terminal is converted to a voltage by the trans-resistance.

* * * * *